United States Patent
Frischeisen et al.

(10) Patent No.: US 11,430,922 B2
(45) Date of Patent: Aug. 30, 2022

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Jörg Frischeisen, Schwabmünchen (DE); Angela Eberhardt, Augsburg (DE); Florian Peskoller, Ingolstadt (DE); Thomas Huckenbeck, Augsburg (DE); Michael Schmidberger, Schwabmünchen (DE); Jürgen Bauer, Wielenbach (DE); Dominik Eisert, Regensburg (DE); Albert Schneider, Thalmassing (DE)

(73) Assignee: OSKAM OLED GMBH, Regensburg (DE)

( * ) Notice: Subject to any disclaimer, the term of this patent is extended or adjusted under 35 U.S.C. 154(b) by 16 days.

(21) Appl. No.: 16/479,198

(22) PCT Filed: Feb. 26, 2018

(86) PCT No.: PCT/EP2018/054684
§ 371 (c)(1),
(2) Date: Jul. 18, 2019

(87) PCT Pub. No.: WO2018/158194
PCT Pub. Date: Sep. 7, 2018

(65) Prior Publication Data
US 2019/0386183 A1    Dec. 19, 2019

(30) Foreign Application Priority Data
Feb. 28, 2017  (DE) .......................... 102017104135.4

(51) Int. Cl.
*H01L 33/50* (2010.01)
*C09J 183/04* (2006.01)
(Continued)

(52) U.S. Cl.
CPC .......... *H01L 33/504* (2013.01); *C09J 183/04* (2013.01); *C09K 11/02* (2013.01);
(Continued)

(58) Field of Classification Search
CPC .......... H01L 33/504; H01L 2933/0041; H01L 33/502; H01L 33/501; H09J 183/04;
(Continued)

(56) References Cited

U.S. PATENT DOCUMENTS 8,772,821 B2    7/2014  Eberhardt et al.
8,987,983 B2    3/2015  Gleitsmann
(Continued)

FOREIGN PATENT DOCUMENTS

DE    102007057812 A1    6/2009
DE    102012210083 A1    12/2013
(Continued)

*Primary Examiner* — Shahed Ahmed
*Assistant Examiner* — Sun Mi Kim King
(74) *Attorney, Agent, or Firm* — Slater Matsil, LLP

(57) ABSTRACT

An optoelectronic component and a method for producing an optoelectronic component are disclosed. In an embodiment an optoelectronic component includes a semiconductor layer sequence having an active region configured to emit radiation at least via a main radiation exit surface during operation and a self-supporting conversion element arranged in a beam path of the semiconductor layer sequence, wherein the self-supporting conversion element includes a substrate
(Continued)

and subsequently a first layer, wherein the first layer includes at least one conversion material embedded in a matrix material, wherein the matrix material includes at least one condensed sol-gel material, wherein the condensed sol-gel material has a proportion between 10 and 70 vol % in the first layer, and wherein the substrate is free of the sol-gel material and the conversion material and mechanically stabilizes the first layer.

19 Claims, 14 Drawing Sheets

(51) Int. Cl.
*C09K 11/02* (2006.01)
*C09K 11/08* (2006.01)
*C09K 11/77* (2006.01)

(52) U.S. Cl.
CPC ...... *C09K 11/0883* (2013.01); *C09K 11/7734* (2013.01); *C09K 11/7774* (2013.01); *H01L 2933/0041* (2013.01)

(58) Field of Classification Search
CPC . C09K 11/02; C09K 11/0883; C09K 11/7734; C09K 11/7774
USPC .......................................................... 257/98
See application file for complete search history.

(56) References Cited

U.S. PATENT DOCUMENTS

| | | | |
|---|---|---|---|
| 9,360,175 B2 | 6/2016 | Eberhardt et al. | |
| 9,738,829 B2 | 8/2017 | Hirosaki et al. | |
| 10,115,871 B2 | 10/2018 | Linkov et al. | |
| 10,297,729 B2 | 5/2019 | Eberhardt et al. | |
| 2013/0163225 A1* | 6/2013 | Nakatsu | G03B 33/06 362/84 |
| 2013/0320385 A1 | 12/2013 | Ahlstedt et al. | |
| 2015/0041841 A1* | 2/2015 | Basin | H05B 33/10 257/98 |
| 2015/0123156 A1* | 5/2015 | Eberhardt | H01L 33/483 257/98 |

FOREIGN PATENT DOCUMENTS

| | | |
|---|---|---|
| DE | 102012220980 A1 | 5/2014 |
| DE | 102015101143 A1 | 7/2016 |
| EP | 1696016 A1 | 8/2006 |
| EP | 2741338 A1 | 6/2014 |
| JP | 2011168627 A | 9/2011 |
| WO | 2005052087 A1 | 6/2005 |
| WO | 2011138169 A1 | 11/2011 |
| WO | 2012080056 A1 | 6/2012 |
| WO | 2012084440 A1 | 6/2012 |
| WO | 2013088309 A1 | 6/2013 |
| WO | 2013144777 A1 | 10/2013 |
| WO | 2013186365 A1 | 12/2013 |
| WO | 2013189809 A1 | 12/2013 |
| WO | 2016124632 A1 | 8/2016 |

* cited by examiner

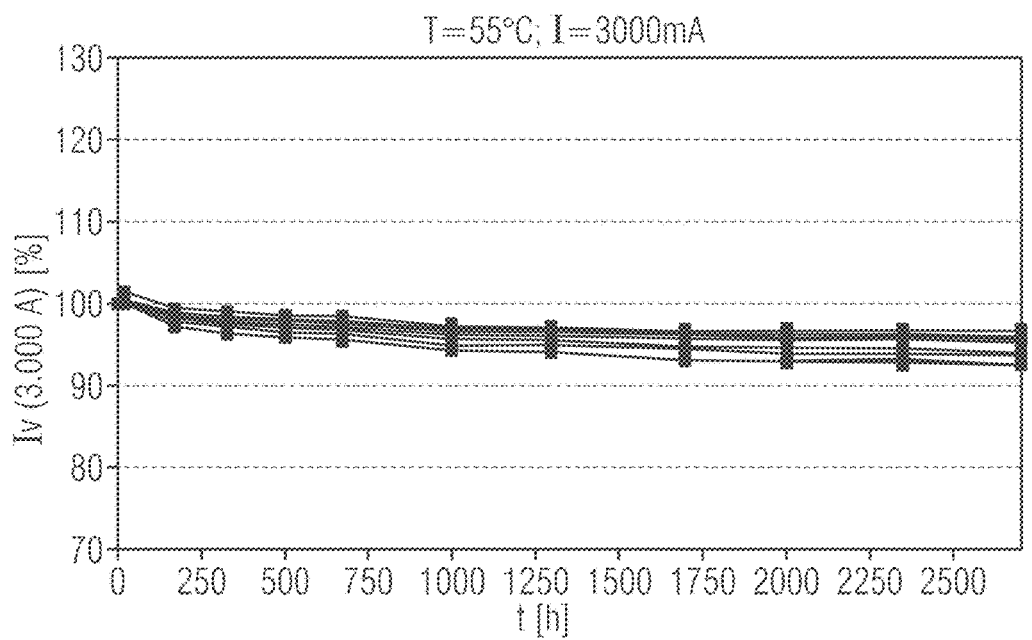
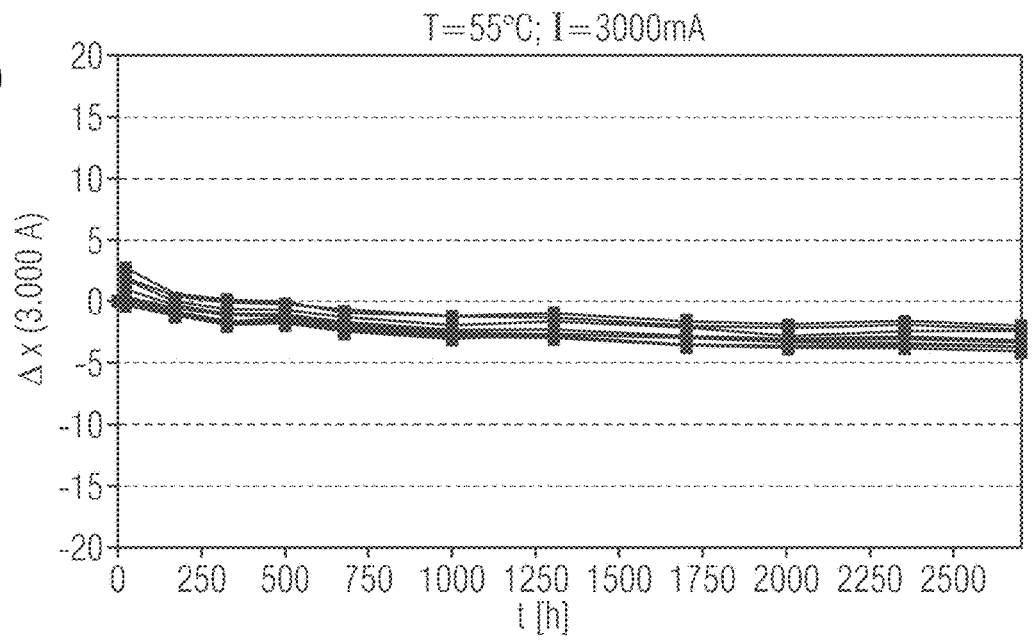

OPTOELECTRONIC COMPONENT AND METHOD FOR PRODUCING AN OPTOELECTRONIC COMPONENT

This patent application is a national phase filing under section 371 of PCT/EP2018/054684, filed Feb. 26, 2018, which claims the priority of German patent application 102017104135.4, filed Feb. 28, 2017, each of which is incorporated herein by reference in its entirety.

TECHNICAL FIELD

The invention relates to an optoelectronic component and to a method for producing an optoelectronic component.

BACKGROUND

Optoelectronic components, for example, light emitting diodes (LEDs), require direct or focused light for many applications, for example, as stage lighting or car headlights. For such applications it is important that the optoelectronic components have a high luminance.

Many optoelectronic components have a conversion element as well as a semiconductor layer sequence. The conversion element is configured to convert the light emitted by the semiconductor layer sequence, in particular light with a wavelength in the blue spectral range, into light of a different, usually longer, wavelength. The conversion takes place using at least one conversion material. For many applications, as much light as possible should be emitted from a defined emission surface so that the light can be directed to a specific surface via optics, for example. In other words, the component should have a high luminance. Conversion elements are often formed in the form of platelets and applied to the semiconductor layer sequence by means of an adhesive. Optionally, the platelets are enclosed with a further material, for example, a silicone filled with $TiO_2$ particles, so that no light emerges laterally from the chip or conversion element but the light emission surface is defined by the surface of the conversion element.

In conventional optoelectronic components, the conversion elements often limit the maximum current density of the LED and thus the maximum luminance. Particularly for applications with a high color rendering index (CRI), for example, for a warm white emitting optoelectronic component with a color temperature of 3200 K, for example, it is necessary to combine a combination of a green and red emitting conversion material in the conversion element. So far, however, it has not been possible to provide conversion elements that comprise a high color rendering index (CRI) for warm white light at high current densities of the optoelectronic component, for example, at more than 1 $A/mm^2$, and enable stable operation at the temperatures occurring during this method.

Up to now, conversion elements have been known which, for example, have a polymer matrix material, such as silicone, in which the conversion material or materials are embedded. However, these conversion elements have a low thermal stability.

Furthermore, conversion ceramics are known. However, these conversion ceramics are limited in that often only one type of conversion material can be used. A combination of different types of conversion materials in the conversion ceramics is generally not possible, as the conversion ceramics are usually produced at temperatures above 1400° C. and different types of conversion materials, such as garnet and nitride based phosphors, would react with each other, changing optical properties such as emission spectrum or quantum efficiency. It is therefore not possible to produce conversion ceramics with a high color rendering index for cold or warm white light.

Furthermore, it is in principle possible to embed conversion materials in glass as matrix material. The challenge here is to find a suitable glass material that is stable against moisture and radiation and in which the conversion material or various conversion materials can be embedded without permanent damage.

The conventional conversion elements described here comprise the disadvantage that they have to be relatively thick in order to guarantee a certain mechanical stability for subsequent handling, for example. As a rule, these have a layer thickness of at least 100 µm. This has the disadvantage that the heat dissipation is significantly reduced compared to thinner conversion elements. However, heat dissipation is very important for high performance applications because large amounts of heat are generated during operation of the optoelectronic component as a result of Stokes heat or loss by the quantum efficiency of the conversion element of less than 100% or by absorption losses.

SUMMARY OF THE INVENTION

Embodiments provide an improved optoelectronic component. In particular, the optoelectronic component should be stable against high temperatures, humidity and radiation. Further embodiments provide a method for producing an optoelectronic component that produces an optoelectronic component with improved properties.

In at least one embodiment, the optoelectronic component comprises a semiconductor layer sequence. The semiconductor layer sequence comprises an active region. The active region emits radiation during operation of the optoelectronic component via a main radiation exit surface. The optoelectronic component comprises a conversion element. In particular, a conversion element and the semiconductor layer sequence are directly connected to each other. The conversion element is self-supported and arranged in the beam path of the semiconductor layer sequence. The conversion element comprises a substrate and a first layer. The first layer is arranged in particular downstream of the substrate. In particular, the first layer is arranged downstream of the semiconductor layer sequence, wherein the substrate is arranged downstream of the first layer. Alternatively, the substrate can be arranged downstream of the semiconductor layer sequence, wherein the first layer is arranged downstream of the substrate. The first layer comprises at least one conversion material embedded in a matrix material. The matrix material is at least a condensed sol-gel material. The sol-gel material is selected from the following group: Water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane. The sol-gel material comprises a proportion between 10 and 70 vol % in the first layer. In particular, this volume proportion is related to the total volume of sol-gel material and conversion material and, where appropriate, hardeners, fillers or other solid additives, but without any pores which may be formed. The substrate is free of the sol-gel material and the conversion material. The substrate is configured to mechanically stabilize the first layer.

According to at least one embodiment, the optoelectronic component comprises a semiconductor layer sequence. The semiconductor layer sequence is preferably based on a III-V compound semiconductor material. The semiconductor material may preferably be based on a nitride compound semiconductor material. "Based on a nitride compound semiconductor material" in the present context means that the semiconductor layer sequence or at least one layer thereof comprises a III-nitride compound semiconductor material, preferably $In_xAl_yGa_{1-x-y}N$, wherein $0 \le x \le 1$, $0 \le y \le 1$ and $x+y \le 1$. This material does not necessarily have to have a mathematically exact composition according to the above formula. Rather, it may contain one or more dopants and additional components which essentially do not alter the characteristic physical properties of the $In_xAl_yGa_{1-x-y}N$ material. For simplicity's sake, however, the above formula contains only the essential components of the crystal lattice (In, Al, Ga, N), even if these may be partially replaced by small amounts of other substances.

The optoelectronic component contains an active region with at least one pn-junction and/or with one or more quantum well structures. During operation of the optoelectronic component, electromagnetic radiation is generated in the active region. A wavelength or maximum wavelength of radiation is preferably in the ultraviolet and/or visible range, particularly at wavelengths between 380 nm and 680 nm inclusive, for example, between 430 nm and 470 nm inclusive.

According to at least one embodiment, the optoelectronic component is a light-emitting diode, or LED for short, or a laser diode. The component is configured to emit radiation with a dominant wavelength from the UV, blue, green, yellow, orange, red and/or near IR spectral range.

According to at least one embodiment, the optoelectronic component comprises a conversion element. The conversion element is configured to convert at least part of the radiation emitted by the semiconductor layer sequence into a secondary radiation. In particular, the secondary radiation comprises a different wavelength, usually longer, than the wavelength of the radiation emitted by the semiconductor layer sequence.

The conversion element is self-supported. The term self-supporting is used here and in the following to describe that the conversion element is self-supporting and that no further elements are required for support. The conversion element can be applied to the semiconductor layer sequence in the so-called pick-and-place process without further support.

According to at least one embodiment, the conversion element comprises a substrate. The substrate can be glass, glass ceramic, sapphire or a transparent or translucent ceramic. Preferably the substrate is glass or sapphire. For example, borosilicate glass such as D263, D263T or D263TECO from the company Schott or, for example, aluminosilicate glass such as AS87 eco from the company Schott can be used as glass. Alternatively, glass-like materials, polycrystalline aluminum oxide or other transparent or translucent materials can also be used. Preferably the substrate should have good stability against humidity, radiation and/or high temperatures. Good stability against humidity means, for example, that after a humidity test at 85° C. and 85% relative humidity after 1000 hours there are no significant changes in the mechanical and optical properties, for example, there should be no turbidity or discoloration, the transmission should change by less than 1% of the initial value and there should be no growths such as crystals on the surface. The same applies to stability against radiation (for example, when irradiated with blue light at 3 W/mm$^2$ for 1000 h) and temperature (for example, 150° C. for 1000 h).

The substrate can be applied to the main radiation exit surface of the semiconductor layer sequence by means of an adhesive. Preferably, however, the first layer is applied to the main radiation exit surface of the semiconductor layer sequence, in particular by means of an adhesive, as this allows the heat generated to be dissipated better from the first layer.

The substrate may comprise other coatings that contribute to improved stability, for example, against moisture.

The substrate is structured according to at least one embodiment. The structuring can be achieved by laser, by applying microlenses to the surface of the substrate or by applying photonic crystal lattices to the surface. The surface of the substrate can be modified, for example, by roughening, sandblasting, polishing, grinding, etching or nanolithography. A sapphire substrate with a special surface structure can also be used (PSS, patterned sapphire substrate).

According to at least one embodiment, the substrate comprises a decoupling foil or decoupling structure. This allows the input and output of radiation to be increased and thus the efficiency of the optoelectronic component to be increased. On the other hand, the decoupling foil or decoupling structure can serve to shape the beam of radiation emitted by the component and direct the beam in a certain direction.

According to at least one embodiment, the substrate comprises coatings. The coating can, for example, comprise a scattering layer to increase the light extraction. The coating can also be used as encapsulation. The encapsulation is intended to protect against environmental influences, for example, moisture.

When using the component as a flash light, it is also possible to change the surface of the substrate in such a way, for example, by scattering layers or by grinding the conversion element, in order to minimize or avoid a yellowish optical impression of the conversion element or a different color impression caused by the conversion materials used, for example.

A further protective layer or encapsulation can be applied to protect the conversion material and/or matrix material and increase the service life. This can be particularly advantageous if the conversion material and/or matrix material has been damaged during processing such as grinding or polishing. If, for example, a phosphor material is used as a conversion material which, for example, has a protective layer on the particles to protect them against environmental influences such as moisture, processing such as grinding or polishing can damage this protective layer. Then a further protective layer can be applied after production of the conversion material to increase the stability. The protective layer can also be applied after a separation process, for example, by sawing, in order to also protect the edges of the conversion element. Suitable protective coatings are, for example, evaporated layers of, e.g., $SiO_2$ and/or $Al_2O_3$, especially layers applied by atomic layer deposition (ALD), or polymer or hybrid polymer layers of, for example, ormocer, polysilazane, polysiloxane, silicone, and/or parylene.

According to at least one embodiment, the substrate comprises functional coatings such as dichroic coatings, interference coatings or anti-reflective coatings. These coatings may have antireflective properties or filter properties. In addition, the substrate may have a dielectric back reflector on the surface which is opposite the main radiation exit surface and reflects back a portion of the radiation passing through the substrate to achieve a more homogeneous edge emission. The substrate may have dielectric filters that reflect at least part of the radiation and thus achieve full conversion. The substrate may have dielectric filters that reflect wavelength-selectively, for example, preferably part of the blue primary radiation while the secondary radiation is hardly reflected to produce a more homogeneous color location at different angles.

The changes to the substrate described here can be made individually or in combination, so that both the substrate side facing the main radiation exit surface and the opposite substrate side can be changed simultaneously or individually.

The dichroic coating can be applied on the substrate side facing the first layer. In general, a dichroic coating consists of several thin layers with refractive index differences. Here the dichroic coating can have two main functions, especially if it is applied to the substrate side facing the first layer and the substrate is applied to the semiconductor layer sequence: On the one hand, it ensures a high transmission of the incoming radiation and, on the other hand, a high reflection of the converted light coming from the conversion element. Both effects increase efficiency or effectiveness. This mode of operation is known to a person skilled in the art and is therefore not explained in detail here. If the first layer is applied to the semiconductor layer sequence, the dichroic coating can be applied to the substrate side facing away from the first layer in order to reduce reflections at the transition between substrate and air.

The dichroic coating described above can alternatively or additionally be arranged on any other outside of the substrate and/or on its edge sides.

According to at least one embodiment, the substrate comprises a filter that can selectively absorb wavelengths. For example, the substrate material can be a filter glass, for example, a short pass, long pass or bandpass filter. This can be advantageous in a full conversion application where the first layer is applied to the semiconductor layer sequence and the substrate absorbs the radiation emitted by the semiconductor layer sequence and transmitted through the first layer, so that the light emitted by the component consists almost entirely of secondary radiation.

The surface treatments of the substrate described here can be applied to the surface of the conversion element accordingly.

According to at least one embodiment, the conversion element comprises a first layer. The first layer may have a surface facing away from the substrate. The first layer can be structured. The structuring can be carried out with the same method as already described for the substrate. For example, the first layer can be polished, ground, etched and/or coated. The surface of the first layer is preferably smooth. This is advantageous if the first layer is applied to the semiconductor layer sequence using an adhesive. A smooth surface enables a thin adhesive layer, for example, with a layer thickness of 500 nm to 15 µm, in particular from 1 µm to 10 µm, ideally from 2 µm to 7 µm. This enables good heat dissipation from the first layer via the adhesive layer to the semiconductor layer sequence, since the adhesive layer generally has a low thermal conductivity and thereby constitutes a heat barrier, particularly in the case of a thick layer, whereby the heat dissipation from the first layer is limited and the temperature in the first layer is very high, which in turn can lead to a lower efficiency of the conversion materials and thus to a lower luminance of the component due to thermal quenchings.

According to at least one embodiment, the thickness of the substrate is between 50 µm and 200 µm, preferably between 100 and 180 µm. When the substrate is applied to the semiconductor layer sequence, the substrate should be very thin and have a high possible thermal conductivity to increase the heat dissipation of the heat generated in the conversion element. It should also be thick enough so that the conversion element is self-supported and easy to handle during production.

In particular, the first layer comprises a homogeneous layer thickness of maximum 100 µm or maximum 90 µm or maximum 80 µm or maximum 70 µm, better maximum 60 µm, preferably maximum 50 µm or maximum 45 µm or maximum 40 µm or maximum 35 µm or maximum 30 µm or maximum 25 µm or maximum 20 µm for partial conversion, ideally from 20 µm to 70 µm. For full conversion, the maximum layer thickness is 200 µm, or maximum 180 µm, or maximum 150 µm, or maximum 130 µm, preferably maximum 110 µm, or maximum 90 µm, or maximum 80 µm, or maximum 70 µm, or maximum 60 µm, or maximum 50 µm, or maximum 40 µm, ideally from 30 µm to 150 µm.

Homogeneous means here and in the following that the layer thickness comprises a maximum deviation of 20%, or 10%, or 5%, or 3%, or 2%, or 0.5% from the mean layer thickness.

According to at least one embodiment, the conversion element comprises a conversion material. Alternatively, more than one conversion material, for example, at least two conversion materials, can exist in the conversion element.

According to at least one embodiment, at least two different conversion materials are embedded in the matrix material.

The conversion material may consist of or comprise inorganic phosphors selected from, for example, the following group or combinations thereof: $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu^2$, $(Sr,Ba,Ca)_2(Si,Al)_5(N,O)_8:Eu^{2+}$, $(Ca,Sr)_8Mg(SiO_4)_4Cl_2:Eu^{2+}$, $(Sr,Ba)Si_2N_2O_2:Eu^{2+}$.

The conversion material may be capable of fully absorbing the radiation of the semiconductor layer sequence and emitting it at longer wavelengths. In other words, a so-called full conversion takes place here, i.e., the radiation of the semiconductor layer sequence does not contribute at all or contributes less than 5% to the resulting total radiation.

Alternatively, the conversion material is capable of partially absorbing the radiation of the semiconductor layer sequence so that the total radiation exiting the conversion element is composed of the radiation of the semiconductor layer sequence and the converted radiation. This can also be referred to as partial conversion. The total radiation can be white mixed light. The mixed light can be warm white or cold white.

According to at least one embodiment, the first layer comprises a thickness between 20 µm and 70 µm for partial conversion. Alternatively, the first layer comprises a thickness between 30 µm and 150 µm for full conversion. In addition, the substrate can be structured, for example, ground or polished, in order to subsequently adjust the overall thickness of the conversion element.

According to at least one embodiment, the conversion element may also contain organic conversion materials, such as organic dyes, or quantum dots. More than two conversion materials can exist in the conversion element. Thus, a color location or the color rendering index can be optimally adjusted. By combining a green and red conversion material, for example, it is possible to produce warm white mixed light with a high color rendering index.

According to at least one embodiment, the first layer has several sublayers. In other words, the first layer can be formed in such a way that the first layer has several conversion materials arranged in different sublayers. The conversion materials can be embedded in the same or different matrix materials. The sublayers may differ in thickness, compactness, matrix material, conversion material, spreader and/or filler.

The conversion material can be spherical. This allows a high degree of conversion material filling to be achieved in the first layer, thus creating a compact first layer. Preferably the conversion element is thin. The conversion element comprises a scatter which is caused by the pores and refractive index differences.

The compactness of the first layer and the surface porosity can be adjusted not only by the component ratios but also during production by selecting suitable process parameters, such as drying, heating, or by controlling the humidity or by means of a temperature ramp.

The compactness of the first layer can also be influenced by the size and shape of the conversion materials and by the ratio between conversion material and matrix material. A first layer that is as compact as possible with a surface that is as closed as possible is advantageous if the first layer is applied to the semiconductor layer sequence by means of adhesive so that little adhesive gets into the pores of the first layer.

The component can be used for stage lighting, flash lighting, automotive applications (e.g., headlights, turn signals, brake lights), lamps, displays, endoscopes, business lighting and/or stadium lighting.

According to at least one embodiment, the conversion element has scattering particles or fillers. The scattering particles or fillers may be, for example, aluminum oxide, aluminum nitride, barium sulphate, boron nitride, magnesium oxide, titanium dioxide, silicon dioxide, silicon nitride, YAG, orthosilicate, zinc oxide or zirconium dioxide as well as AlON, SiAlON or combinations or derivatives thereof or other ceramic or vitreous particles, metal oxides or other inorganic particles. The scattering particles or the fillers can have different shapes, for example, spherical, rod-shaped or disc-shaped, with particle sizes ranging from a few nanometers to a few tens of micrometers. Smaller particles can be used to adjust the viscosity of the suspension. Larger particles can contribute to the production of a compact first layer and/or to improved heat dissipation, moisture resistance, or thickness homogeneity. The scattering can be changed and/or the mechanical stability can be improved.

According to at least one embodiment, the conversion element comprises additives. An additive can be aerosil or silica, such as sipernate. This allows the viscosity of the suspension to be modified and the proportion between the liquid and solid components to be adjusted.

According to at least one embodiment, the conversion element is made of several layers, which can vary in layer thickness, compactness, matrix material, conversion material, scatters and/or fillers.

According to at least one embodiment, the matrix material or conversion element additionally comprises a chemical hardener. By adding a chemical hardener and curing the matrix material, for example, between a temperature of 150 to 350° C. for water glass, it is possible to produce a conversion element that is very stable against moisture. In particular, this conversion element shows a high stability at 85° C., 85% relative humidity and 1000 hours for the test duration, which was determined by means of a humidity test. The addition of the hardener results in the formation of a further by-product in addition to possibly formed alkali carbonate. In the case of a phosphate hardener, this would be an alkali metal phosphate.

Preferably no chemical hardener is added to aluminum phosphate, monoaluminum phosphate or modified monoaluminum phosphate. The aluminum phosphate, monoaluminum phosphate or modified monoaluminum phosphate described here preferably has an Al to P molar ratio of 1:3 to 1:1.5 and hardens particularly at temperatures between 300° C. and 400° C. The solutions may contain further elements or compounds, but preferably a maximum of 1 mol % of alkali and halogen compounds.

Water glass is the term used to describe glass-like, amorphous, water-soluble sodium, potassium and/or lithium silicates or their aqueous solutions that have solidified from a melt. Water glass thus differs from conventional glass particularly in its properties such as porosity. The water glass used for the matrix material may consist at least of lithium water glass, sodium water glass, potassium water glass or a mixture thereof, or may contain alkali water glasses. The inventors have recognized that a combination of lithium water glass and potassium water glass in particular has excellent properties for the matrix material. Preferably, the ratio between lithium water glass and potassium water glass is between 1:3 and 3:1. In particular, the ratio between lithium water glass and potassium water glass is 1:3, 1:1 or 3:1, preferably 1:1.

The alkali water glasses can, for example, have a modulus from 1.5 to 5, preferably a modulus from 2.5 to 4.5. The term modulus is the molar ratio of $SiO_2$ to alkali oxide known to a person skilled in the art. Therefore it will not be explained here.

According to at least one embodiment, the conversion element comprises a matrix material. Pure matrix material without impurities, such as iron or other transmission-reducing substances, should preferably be used in order to avoid absorption losses.

A metal phosphate such as aluminum phosphate, monoaluminum phosphate or a modified monoaluminum phosphate can be used as matrix material. In particular, reagents which, for example, have an oxidizing effect during coating, drying or curing, can be used to avoid intrinsic absorption behavior of the matrix material, as this reduces efficiency. Temperature treatment in a defined atmosphere is also possible.

According to at least one embodiment, the conversion material is homogeneously distributed in the matrix material. Alternatively, the conversion material in the matrix material may have a concentration gradient, for example, towards away from the semiconductor layer sequence an increase in the concentration of the conversion material. For example, larger particles can be located closer to the substrate and smaller particles can be located on the surface of the conversion element, i.e., on the side facing away from the substrate. This reduces backscattering. In particular, the backscattering of the blue light, so the light emitted by the semiconductor layer sequence, can be reduced. This reduces the amount of blue radiation that hits the semiconductor layer sequence back. This can provide an efficiency advantage, as part of the light is usually absorbed in the semiconductor layer sequence or at adjacent layers, for example, as a mirror coating.

According to at least one embodiment, the matrix material comprises or consists of at least one condensed sol-gel material. Sol-gel materials are referred to here and in the following as those materials which are produced by means of a sol-gel process. The sol-gel process is a method for the production of inorganic or hybrid polymer materials from colloidal dispersions, the so-called sols. The starting materials are also referred to as precursor materials. In a first basic reaction, finest particles are formed from them in solution. Through the special further processing of the sols powders, fibers, layers or aerogels can be produced. The essential basic process of the sol-gel process is the hydrolysis of the precursor materials and the condensation between the resulting reactive species. The sol-gel process is sufficiently well known to a person skilled in the art and is not explained in detail here.

According to at least one embodiment, the sol-gel material is selected from the following group: Water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane.

According to at least one embodiment, the matrix material comprises a proportion of 10 to 70 vol % in the first layer. Preferably the proportion is at 15 to 50 vol %, for example, at 20 to 40 vol %.

Optoelectronic components, which preferably emit cold white light, preferably have a sol-gel material with a proportion between 10 and 70 vol % in the first layer.

Optoelectronic components emitting warm white light preferably have a proportion of sol-gel material in the first layer between 20 and 40 vol %.

The proportion of sol-gel material depends, among other things, on the particle size and activator content of the conversion material and is not limited to the specified values.

Due to the proportion of the sol-gel material in the conversion element, a very good moisture stability can be achieved and thus a stable optoelectronic component can be produced.

According to at least one embodiment, the substrate is free of the sol-gel material or matrix material. In other words, the substrate has no sol-gel material as a component. However, this does not mean that the surfaces of the substrate are free of the sol-gel material of the conversion element. For example, the conversion element or the first layer comprising the sol-gel material can be applied directly to the substrate, while doing a direct connection between the substrate and the sol-gel material. The substrate serves to mechanically stabilize the first layer, so that the conversion element is self-supporting.

According to at least one embodiment, the matrix material is prepared from a metal phosphate solution, for example, a solution of aluminum phosphate, monoaluminum phosphate or modified monoaluminum phosphate.

According to at least one embodiment, the matrix material is a condensed sol-gel material prepared from an aluminum phosphate solution or from a monoaluminum phosphate solution or from a modified monoaluminum phosphate solution.

According to at least one embodiment, the matrix material is a condensed sol-gel material prepared from a solution of water glass or from a mixture of a solution of several water glasses and optionally additional hardeners.

According to at least one embodiment, the self-supporting conversion element is arranged on the main radiation exit surface by means of an adhesive. By main radiation exit surface is meant the area of the semiconductor layer sequence perpendicular to the growth direction of the semiconductor layer sequence and facing the conversion element.

According to at least one embodiment, the conversion element is glued to the main radiation exit surface by means of an adhesive. The gluing can be carried out using an inorganic or organic adhesive. The adhesive layer should be as thin as possible, for example, with a layer thickness of 500 nm to 15 µm, in particular from 1 µm to 10 µm, ideally from 2 µm to 7 µm.

According to at least one embodiment, the adhesive is a silicone and the self-supporting conversion element is free of the silicone.

According to at least one embodiment, the conversion element is arranged on the main radiation exit surface by means of an adhesive, while the conversion element being glued to the side of the first layer.

According to at least one embodiment, the conversion element is arranged by means of an adhesive on the main radiation exit surface, wherein the side of the substrate which is not coated with the first layer is glued on.

According to at least one embodiment, the first layer is disposed by means of an adhesive on the main radiation exit surface, and wherein the first layer is disposed directly on the substrate.

According to at least one embodiment, the optoelectronic component emits radiation with a color temperature between 2500 K and 4500 K during operation. In addition, the color rendering index CRI can be between 70 and 100.

According to at least one embodiment, the optoelectronic component exhibits radiation with a color temperature between 4500 K and 8000 K during operation. In addition, the optoelectronic component can have a color rendering index CRI between 70 and 100.

According to at least one embodiment, the condensed sol-gel material comprises a proportion between 20 and 50 vol % in the first layer. An optoelectronic component that preferably emits warm white light preferably has a proportion between 20 and 40 vol %. The proportion of volume percentages refers to the total proportion of the first layer.

According to at least one embodiment, the conversion element is inorganic. In other words, the conversion element has only inorganic components and is free of organic materials. For example, the conversion element has no silicone.

According to at least one embodiment, the conversion element contains several conversion materials to set the chromaticity coordinates or CRI. By combining, for example, a green and red conversion material, warm white or cold white light can be produced, especially with a high CRI.

By using two types of conversion material, the emission spectrum can be adapted accordingly and a desired CRI and R9 value can be obtained. Usually the conversion material contains particles with different particle size distributions. When using several conversion materials, it has been shown that the appropriate adjustment of the particle size can be decisive in order to produce a packing that is as dense as possible and thus to obtain a compact first layer with good thermal conductivity. Alternatively, particles of a conversion material of different sizes can be mixed to create a dense package.

A layer effect can be created by sedimentation of the conversion materials. The different sedimentation rates of the conversion materials can be exploited. The different sedimentation rate results from the different particle size, shape and/or density of the conversion material. Such an arrangement may result in a better heat dissipation, reduced intensity quenching, for example, of a red emitting conversion material, or a change in the CRI or R9 value. This can be caused by a different reabsorption of the conversion materials.

According to at least one embodiment, laterally structured layers are produced which can vary in thickness, compactness, matrix material, conversion material, scatter and/or filler.

According to at least one embodiment, the substrate can be removed after applying the conversion element to the main radiation exit surface. The removal can be done, for example, by liftoff or other processes, for example, chemical dissolution or mechanical or thermal removal. Alternatively, a sacrificial layer between substrate and first layer can be used instead of liftoff, whereby the sacrificial layer is, for example, modified chemically, thermally or by radiation in such a way that the substrate can be removed.

According to at least one embodiment, a substrate with a thermal expansion coefficient is used such that the conversion element and the substrate exhibit a low distortion after curing during production due to temperature change. The separation can be carried out by sawing, for example, by diamond sawing, laser cutting, scribing and breaking or by stealth dicing. The coefficient of expansion of the substrate is, for example, $4*10^{-6}$ 1/K to $11*10^{-6}$ 1/K, preferably $5*10^{-6}$ 1/K to $10*10^{-6}$ 1/K for a temperature range of 20-300° C.

The inventors have found out that by combining the semiconductor layer sequence described here and the conversion element, a component can be provided that comprises a high luminance with a high color rendering index. In comparison to conventional optoelectronic components, which comprises silicone as matrix material in the conversion element, the inorganic matrix materials described here comprise a high thermal conductivity, a high temperature stability and a high stability against radiation. The first layer can be similarly thin, or even thinner, compared to conventional conversion elements that use silicone as the matrix material. This is possible because the matrix material here is a condensed sol-gel material which typically has a lower viscosity than silicone and therefore a higher proportion of conversion material can be introduced during production. In addition, the condensed sol-gel material shrinks during production, mainly due to solvent removal, resulting in greater compactness. In addition, the first layer described here is arranged on a substrate in order to produce mechanical stabilization of a self-supporting conversion element. It can thus be easily arranged in the pick-and-place process on the main radiation exit surface of the semiconductor layer sequence. The arrangement of the conversion element can be directly on the semiconductor layer sequence. Alternatively, other layers or elements, such as the adhesive, a passivation layer and/or encapsulation, may be arranged between the conversion element and the main radiation exit surface.

According to at least one embodiment, the first layer is arranged between the main radiation exit surface and the substrate. In other words, the conversion element is glued onto the main radiation exit surface via the first layer. This orientation of the conversion element is preferred because the conversion material in the first layer is located as close as possible to the main radiation exit surface and the heat generated in the first layer can be easily dissipated via the main radiation exit surface, thus increasing efficiency and/or service life.

Alternatively, the substrate can be located between the main radiation exit surface and the first layer. In other words, the conversion element is glued onto the main radiation exit surface via the substrate side that is not coated with the first layer.

The inorganic conversion element described here can be operated at higher operating currents than conversion elements containing organic materials. In addition, these conversion elements have a higher luminance and luminous flux and can have a high color rendering index (CRI).

Preferably, the conversion element should be very thin, highly filled with the conversion material and inorganically shaped. The substrate can be formed transmissive (transparent or translucent). This refers here and in the following to a substrate that has an internal transmission of >90%, preferably >95%, particularly preferably >99%, at least with respect to the primary and secondary wavelengths. Internal transmission here means the transmission without reflection at the surfaces (Fresnel reflection).

The adhesive can also be the same material as the matrix materials for the conversion element described here. Alternatively, the adhesive can be a glass, particularly a low-melting glass, or a polymer. The adhesive may contain fillers.

According to at least one embodiment, the conversion material and/or matrix material is produced on the substrate by doctor blading, screen printing, stencil printing, dispensing, spray coating, spin coating, electrophoretic deposition or by a combination of these different methods.

The optoelectronic components used here offer numerous advantages:

An optoelectronic component can be provided with a high color rendering index at significantly higher operating current density compared to conversion elements comprising silicon as matrix material. High-performance warm white and cold white optoelectronic components can be provided. In addition, the optoelectronic components can be used for other color locations or for full conversion applications. The color coordinates and the color rendering index of the emitting radiation can be adjusted here for high-performance applications, which is not possible with ceramic converters, for example. A higher luminance and a higher luminous flux per chip area compared to optoelectronic components using silicon as matrix material can be provided. A higher operating performance due to better heat dissipation can be used compared to organic matrix materials such as silicone. In addition, these optoelectronic components can be operated at higher operating temperatures compared to silicone as matrix material, since conventional components with silicone as matrix material already degrade at 160 to 180° C. In addition, several optoelectronic components can be produced simultaneously. This reduces production costs and time.

Embodiments of the invention also relate to a method for producing an optoelectronic component. The optoelectronic component described here is preferably produced using this method. All embodiments and definitions for the optoelectronic component also apply to the method and vice versa.

According to at least one embodiment, the method has the following steps:

A) providing a semiconductor layer sequence having an active region which emits radiation via at least a main radiation exit surface during operation, B) Application of a conversion element at least to the main radiation exit surface, which is self-supporting and is produced as follows before application:

B1) introducing at least one conversion material into a matrix material to form a dispersion, wherein the matrix material comprises at least one solution of a sol-gel material selected from the group consisting of water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, B2) applying a dispersion to a substrate to form a first layer, wherein the substrate is free of the sol-gel material and the conversion material and serves for mechanical stabilization, B3) heating the substrate and the first layer to a maximum of 500° C. or 350° C.; and B4) optionally smoothing a surface of the first layer facing away from the substrate.

Step B) can be carried out, for example, by doctor blading, screen printing, stencil printing, dispensing, spray coating, spin coating or dip coating. A dispersion is defined here in particular as a homogeneous mixture of at least two substances. The smoothing can be done by polishing or grinding, for example.

According to at least one embodiment, step B3) or B4) is followed by an additional step B5): separating the substrate and the first layer to produce a plurality of conversion elements, wherein at least one conversion element is disposed on the main radiation exit surface.

To create a compact first layer, it can be advantageous to create the first layer in more than one step. For example, the first layer can have several sublayers that are produced one after the other and thus have a smaller layer thickness and can be produced more compactly than a single first layer.

Drying and curing can take place between the individual production steps of applying the sublayers. Since the conversion element has a certain porosity, a material such as a polymer such as silicone or polysilazane, or generally a material with low light absorption in the wavelength range of the excitation wavelength or the converted light, can be introduced into the pores.

In addition, a coating can be applied to the conversion element to close the pores of the conversion element. The coating may have the same matrix material. The coating may also contain a filler. In addition or alternatively, the edges of the conversion element can be coated, for example, using molding or casting. Silicone with titanium dioxide particles, for example, can be attached to the edges of the conversion element for this purpose.

Between the substrate and the first layer there may be other layers, for example, protective layers, which can protect the substrate from a hard conversion material to prevent the substrate from being damaged during the coating process and to prevent scratches, cracks or microcracks from forming. A protective layer can be made of aluminum oxide or silicon dioxide, for example.

The lateral expansion of the conversion element can be 1 mm×1 mm or approximately 1.3 mm×1.5 mm. In principle, however, other dimensions are also possible. The total thickness of the conversion element can be between 30 μm and 2 mm, preferably between 50 μm and 500 μm, particularly preferably between 100 μm and 250 μm.

In addition, the conversion element may have areas where there are recesses, for example, to release a bond pad when attaching the conversion element to the semiconductor layer sequence, via which the semiconductor layer sequence is electrically contacted. This area can be created later. The production can be done mechanically, for example, by sawing or laser cutting.

Embodiments of the invention also relate to a conversion element. The optoelectronic component described here preferably has the conversion element. All embodiments and definitions for the optoelectronic component also apply to the conversion element and vice versa.

According to at least one embodiment, the conversion element is self-supporting and may be arranged in the beam path of the semiconductor layer sequence. The self-supporting conversion element comprises a substrate and a first layer, wherein the first layer comprises at least one conversion material embedded in a matrix material, wherein the matrix material comprises at least one condensed sol-gel material selected from the group consisting of water glass, metal phosphate, monoaluminum phosphate, aluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, A metal alkoxane, wherein the condensed sol-gel material has a proportion between 10 and 70 vol % in the first layer, wherein the substrate is free of the sol-gel material and the conversion material and serves to mechanically stabilize the first layer.

BRIEF DESCRIPTION OF THE DRAWINGS

Further advantages, advantageous embodiments and further developments result from the exemplary embodiments described in the following in connection with the figures.

Show it:

FIGS. 7A to 7H show data from robustness tests; and

In the exemplary embodiments and figures, identical, similar or similarly acting elements can each be provided with the same reference numbers. The represented elements and their proportions among each other are not to be regarded as true to scale. Rather, individual elements, such as layers, components, components and areas, can be displayed in an exaggeratedly large format for better representability and/or better understanding.

DETAILED DESCRIPTION OF ILLUSTRATIVE EMBODIMENTS

The FIGS. 1A to 1H each show a schematic side view of an optoelectronic component 100 according to an embodiment.

Figure 1A:
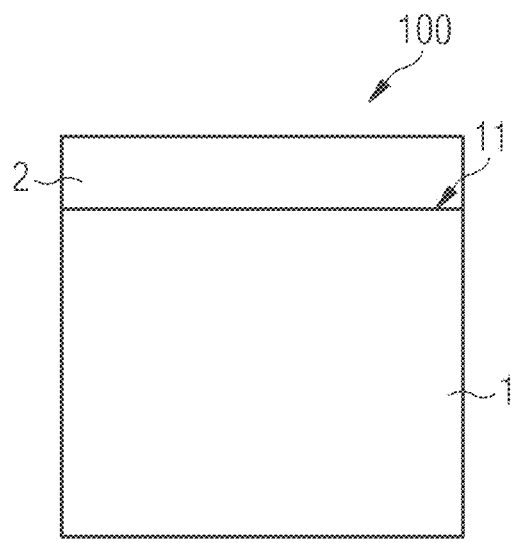
FIGS. 1A to 1H show schematic side views of an optoelectronic component according to an embodiment.
Figure 1B:
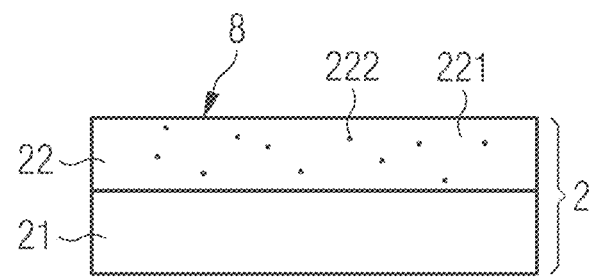

The optoelectronic component 100 of FIG. 1A comprises a semiconductor layer sequence 1. The semiconductor layer sequence 1 can, for example, be made of InAlGaN. The semiconductor layer sequence comprises an active region which emits radiation at least via a main radiation exit surface 11 during operation. For example, the semiconductor layer sequence 1 emits radiation from the blue spectral range. A conversion element 2 is arranged directly on the main radiation exit surface 11. Alternatively, between conversion element 2 and semiconductor layer sequence 1, additional layers, such as an adhesive layer 3 as shown in FIGS. 1D to 1G, may be arranged.

The conversion element 2 comprises a first layer 22 arranged on a substrate 21. The arrangement can be direct or indirect. Direct means here that no further layers or elements are arranged between the first layer 22 and the substrate 21 (see FIG. 1B). The first layer 22 may contain a matrix material 221, i.e., a condensed sol-gel material, for example, a water glass or metal phosphate. In the matrix material 221 can be embedded at least one conversion material 222. More than one conversion material 222 may also be embedded in the matrix material 221. Conversion material 222 can be any material configured to convert the radiation emitted by the semiconductor layer sequence 1 into radiation with a changed, usually longer, wavelength.

The first layer 22 may have a structured surface 8 facing away from the substrate 21. The structuring can be carried out by polishing, grinding, etching or by coating.

Figure 1C:
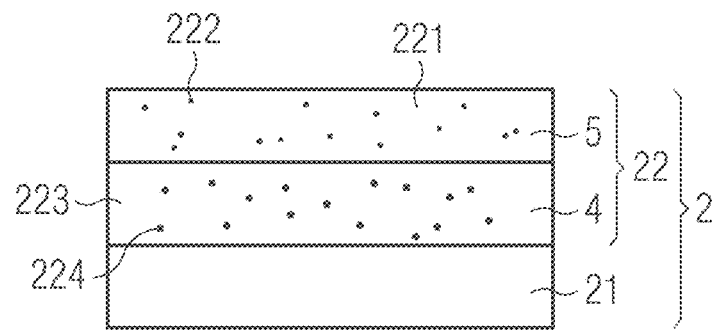

As shown in FIG. 1C, the conversion element 2 may have not only a first layer 22, but the first layer 22 may be formed by further sublayers 4 and 5. Conversion materials 222, 224 can be arranged in the sublayers 4, 5. The conversion materials 222, 224 can be the same or different. The conversion materials 222, 224 are each embedded in a matrix material 221, 223. The matrix material 221, 223 can be, for example, water glass or metal phosphate. The matrix material 221, 223 of the sublayer 4 and the sublayer 5 may be identical or different. The sublayers 4, 5 can be arranged on the substrate 21. The substrate 21 can be glass, glass ceramic, sapphire or transmissive ceramic.

Figure 1D:
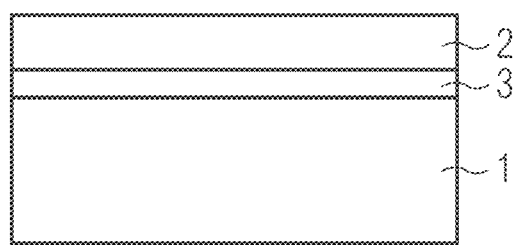

FIG. 1D shows that an adhesive layer 3 is arranged between the semiconductor layer sequence 1 and the conversion element 2.

Figure 1E:
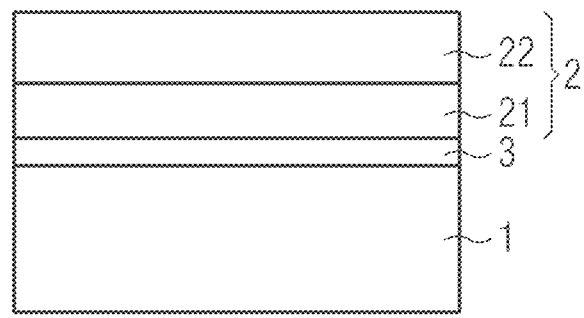

As shown in FIG. 1E, the substrate 21 may be located between the main radiation exit surface 11 (not shown here) and the first layer 22. The substrate 21 can therefore be directly downstream of the adhesive layer 3 or the main radiation exit surface 11.

Figure 1F:
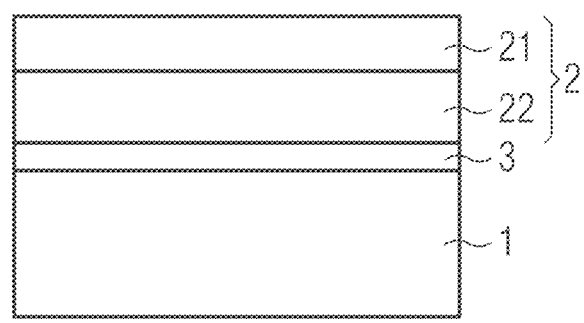

Alternatively, as shown in FIG. 1F, the first layer 22 may be located between the main radiation exit surface 11 (not shown here) and the substrate 21. The first layer 22 can therefore be placed directly after the adhesive layer 3 or the main radiation exit surface 11.

Figure 1G:
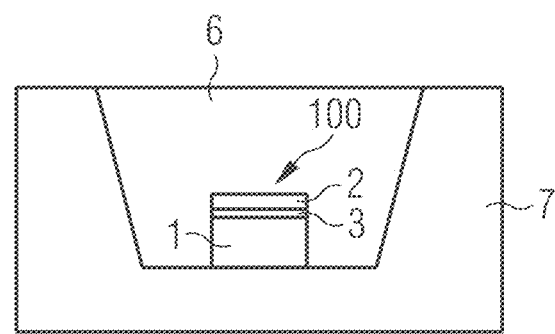

FIG. 1G shows the arrangement of the optoelectronic component 100 in a housing 7. The housing can have a recess in which the optoelectronic component 100 is arranged. The recess can be filled with a potting 6, for example, silicone or another inorganic potting material.

Figure 1H:
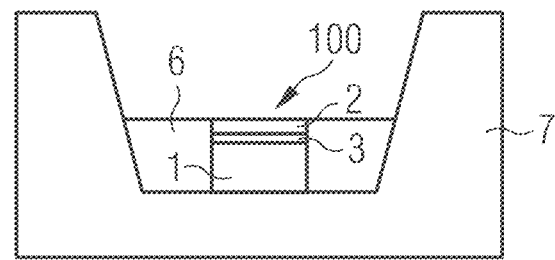

FIG. 1H shows the arrangement of the optoelectronic component 100 in a housing 7. The housing can have a recess in which the optoelectronic component 100 is arranged. The recess can be filled with a potting 6, for example, silicone or another inorganic potting material. Contrary to the embodiment of FIG. 1G, here the potting 6 is only filled up to the upper edge of the conversion element. The potting 6 may contain silicone filled with $TiO_2$ particles, for example.

Figure 2A:
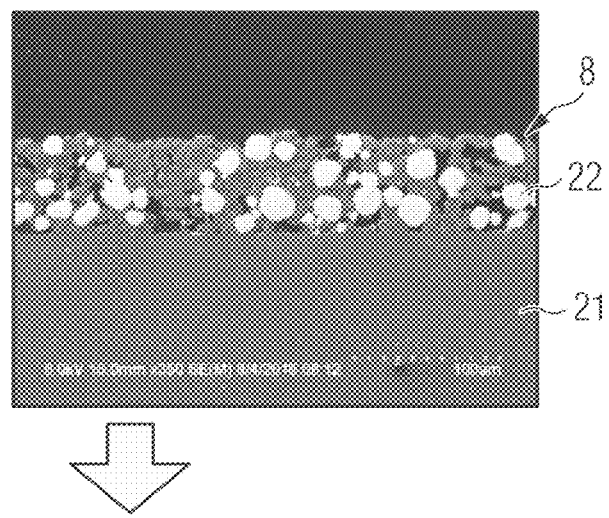
FIGS. 2A to 2D show optoelectronic components according to an embodiment.
Figure 2A:
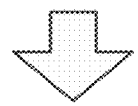
Figure 2B:
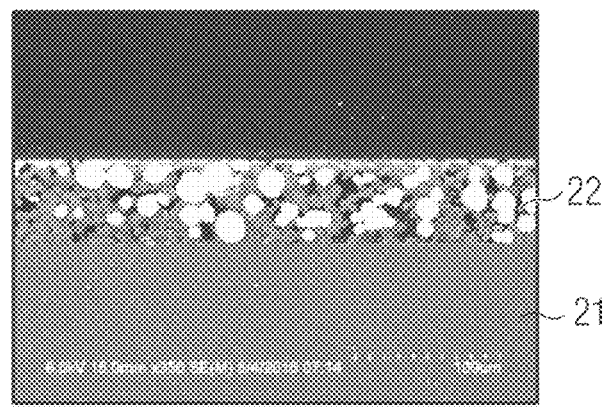

FIGS. 2A and 2B each show scanning electron microscope images of a conversion element 2 according to an embodiment.

FIG. 2A shows a glass substrate 21 on which a first layer of 22 is arranged. The first layer shows roughening on its surface 8, which faces away from the substrate 21. In comparison, as shown in FIG. 2B, this surface 8 is smoothed. Smoothing can be done by polishing or grinding, for example. Very thin first layers 22 can be produced, for example, with a layer thickness of <50 μm.

Figure 2C:
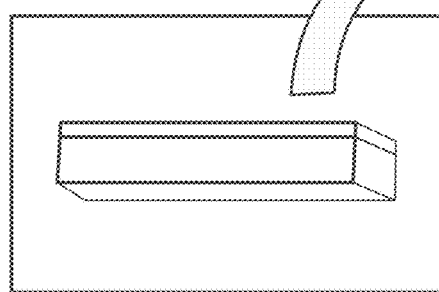
Figure 2D:
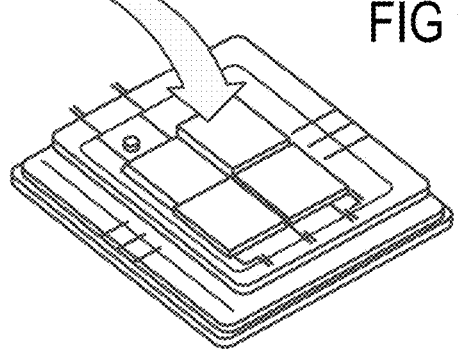

An optoelectronic component 100 can thus be made available which, like a silicone matrix, comprises all the color coordinates and a high color rendering index. In comparison to a silicone matrix, however, the component 100 can be operated at high operating currents, current densities and temperatures. As shown in FIGS. 2C and D, the optoelectronic component 100 can also be arranged in matrix form. The lateral expansion of the conversion element can be 1 mm×1 mm or approximately 1.3 mm×1.5 mm.

Figure 3C:
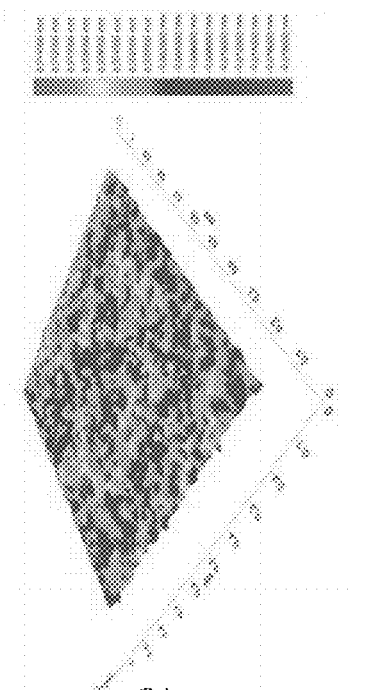
FIGS. 3C and 3F show surface images by means of cyber-scan profilometry according to an execution form.
Figure 3B:
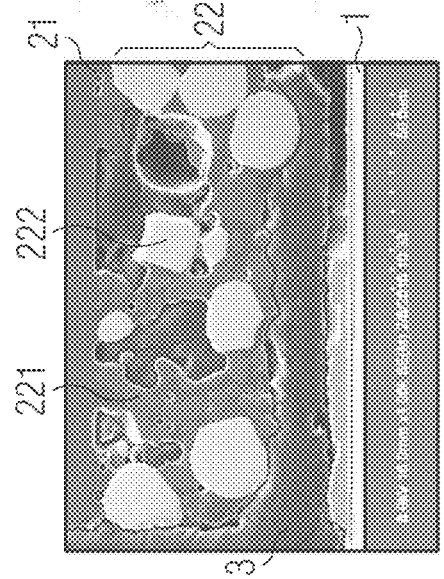
FIGS. 3A, 3B, 3D, 3E and 9A to 9E show the scanning of electron microscope images according to an embodiment.
Figure 3A:
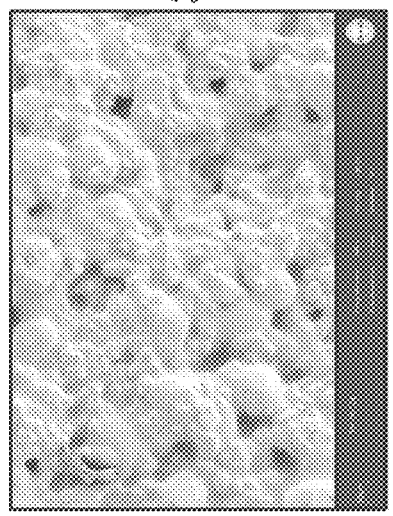

The FIGS. 3A to 3F show the comparison of conversion elements that are polished (FIGS. 3D to 3F) or unpolished (FIGS. 3A to 3C).

FIG. 3A shows a scanning electron microscope (SEM) image in which the matrix material 221 is aluminum phosphate, wherein the first layer 22 comprises no polished surface. FIG. 3B shows the corresponding cross-section after gluing onto a semiconductor layer sequence 1 and FIG. 3C shows the corresponding cyber-scan profilometry.

Figure 3F:
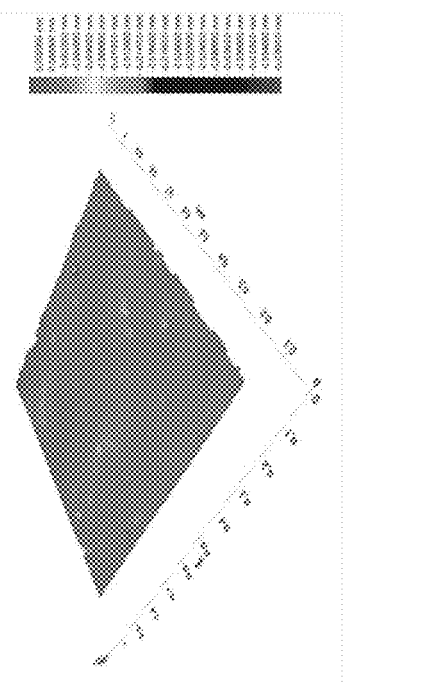
Figure 3E:
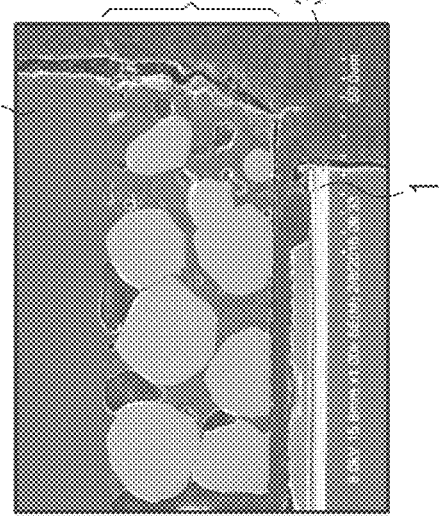
Figure 3D:
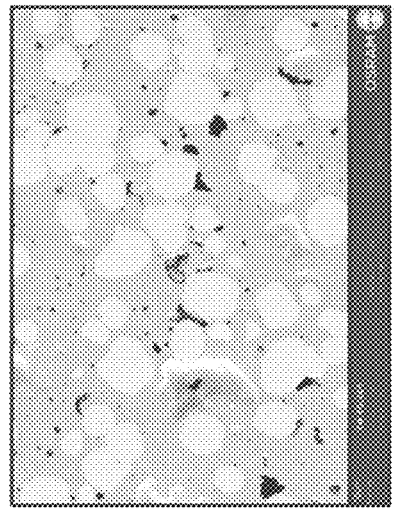

In comparison, FIG. 3D shows a polished surface of the first layer 22 where the matrix material 221 is aluminum phosphate, FIG. 3E shows a cross-section of a polished first layer after gluing to a semiconductor layer sequence 1 and FIG. 3F shows a cyber scan profilometry.

It can be seen that by using a polished surface, the particles of the conversion material are ground down and thus the thickness of the adhesive layer 3 can also be reduced. For example, polishing can reduce the layer thickness of the adhesive layer 3 from the original 15 μm, so unpolished, to 5 μm and thus increase heat dissipation, thus enabling a higher operating current density.

Figure 4:
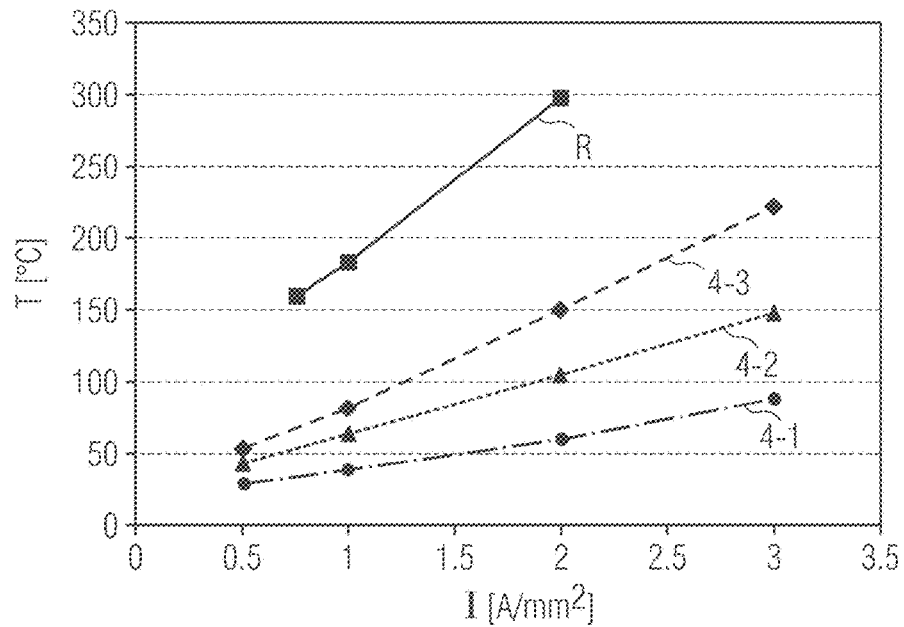
FIG. 4 shows the temperature as a function of the current density.

FIG. 4 shows the converter temperature T in ° C. measured from the side of the conversion element facing away from the semiconductor layer sequence as a function of the operating current density I in $A/mm^2$ of a semiconductor layer sequence 4-1 which emits only blue light, a conversion element 4-2 which comprises a polished surface 8, a conversion element 4-3 which comprises an unpolished surface 8, and as reference R a conversion element with a conversion material 222 in the matrix material silicone.

It can be seen from the figure that a significant reduction in the converter temperature of a polished conversion material, in which, for example, aluminum phosphate is used as matrix material, can be produced at high operating currents of 3 $A/mm^2$. The application of a conversion material to a substrate, particularly glass, allows the use of higher operating currents and densities and a higher luminous flux per chip area for warm white applications.

Figure 5A:
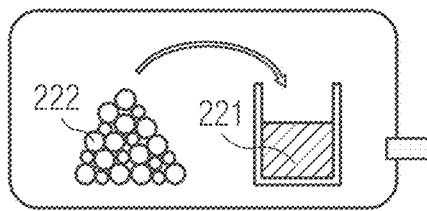
FIGS. 5A to 5F show methods for producing an optoelectronic component according to an embodiment.
Figure 5B:
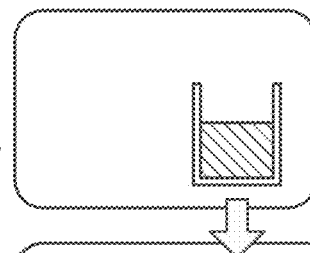
Figure 5D:
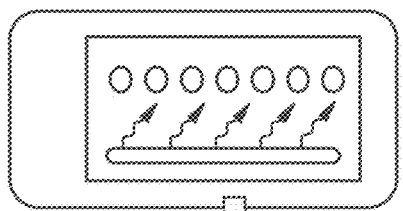
Figure 5C:
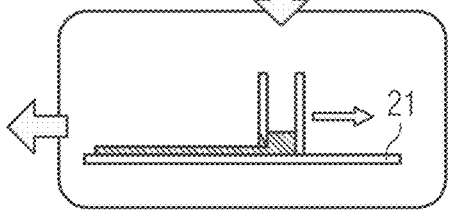
Figure 5E:
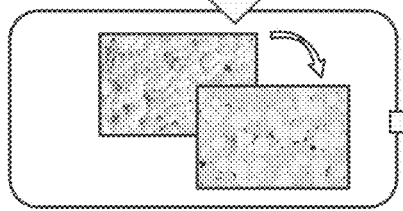

FIGS. 5A to 5F show a method for producing an optoelectronic component according to an embodiment. In particular, a conversion element 2 is produced here. A conversion material 222 is provided and introduced into a liquid sol-gel material 221. A dispersion is generated (see FIG. 5B). This dispersion can be applied to a cleaned substrate 21. The cleaning can be done, for example, with a solvent or with ultrasound or by plasma treatment. The volume proportion of the matrix material 221 in the first layer 22 is between 10 and 70 vol %. The mixing to produce the dispersion can be carried out by homogenization. As shown in FIG. 5C, the dispersion can then be applied to a substrate, such as glass, by doctor-blading. Then it can be heated to 350° C., for example. The heating can take place in an oven, for example. If necessary, the surfaces of the conversion material can then be smoothed as shown in FIG. 2E.

Figure 5F:
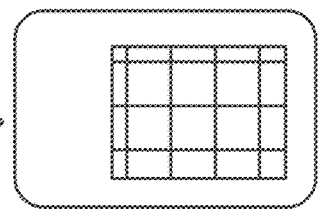

Subsequently, a separation can optionally be carried out so that several conversion elements can be generated cost-effectively, as shown in FIG. 5F. The separation can, for example, be carried out using a saw.

Figure 6:
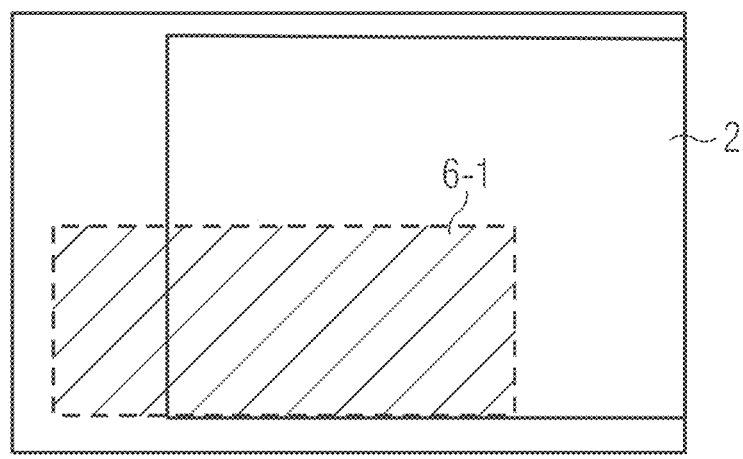
FIG. 6 shows an optoelectronic component according to an embodiment.
Figure 7A:
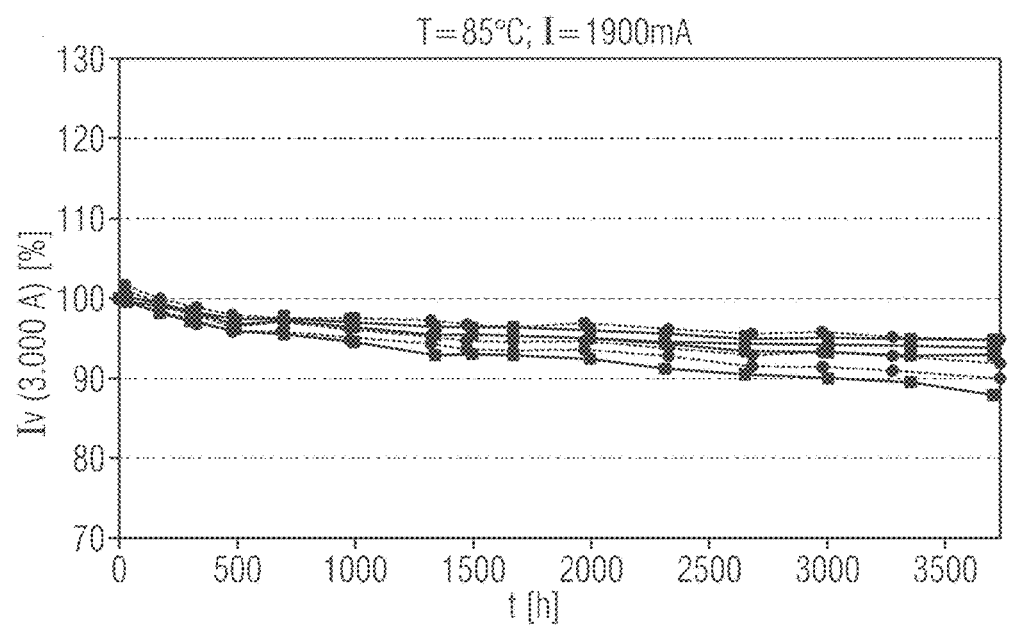
Figure 7B:
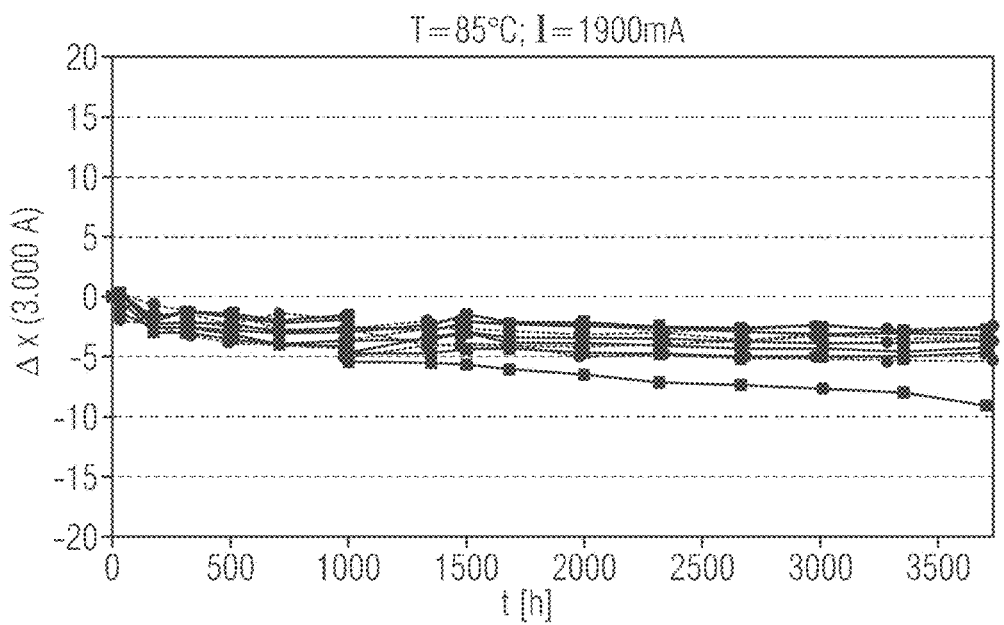
Figure 7E:
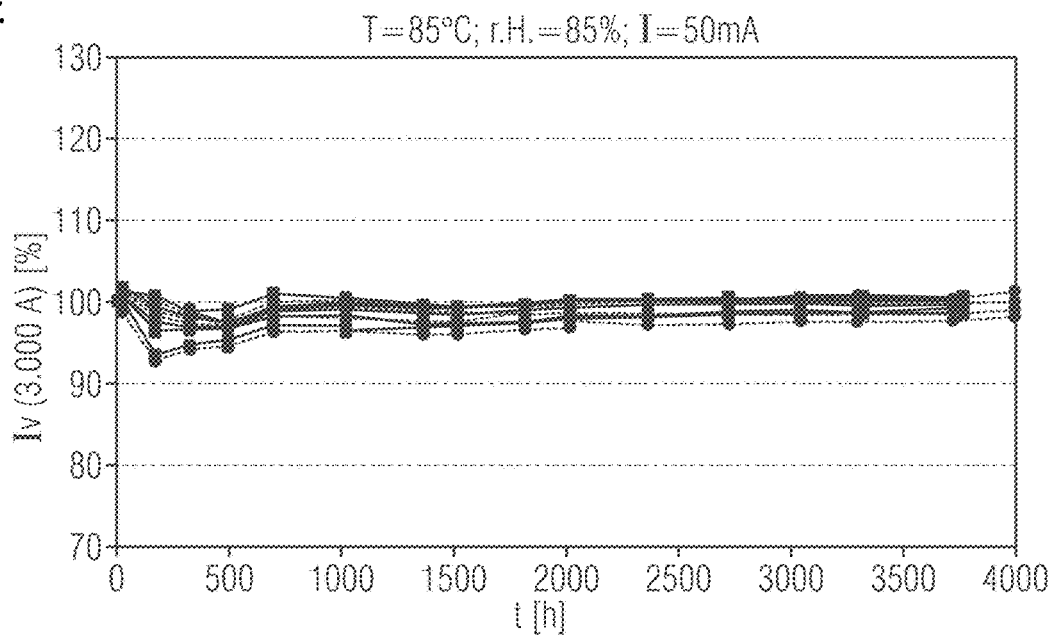
Figure 7F:
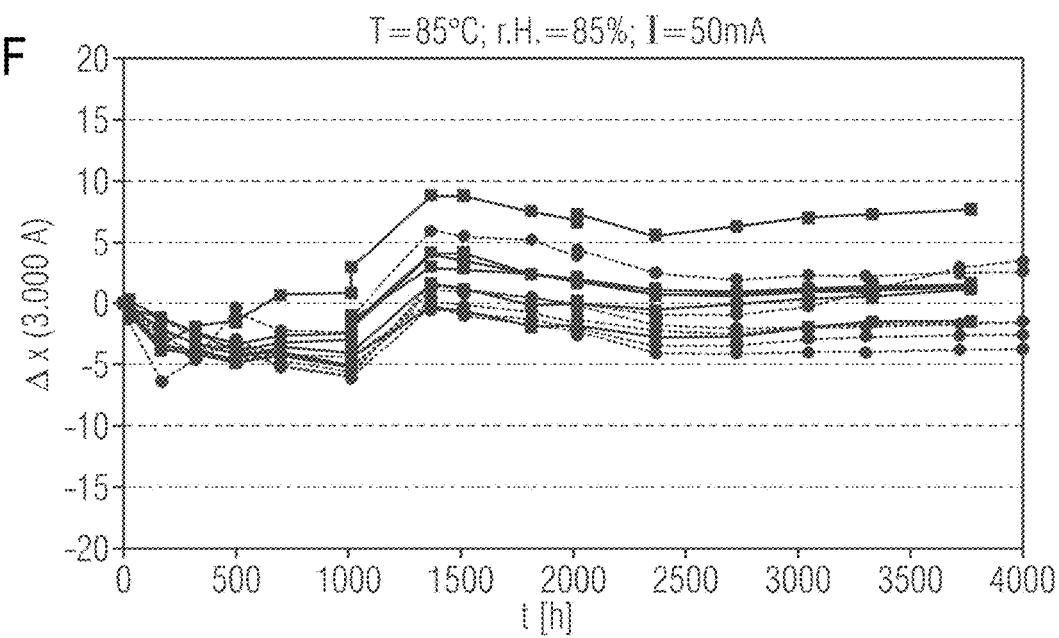
Figure 7G:
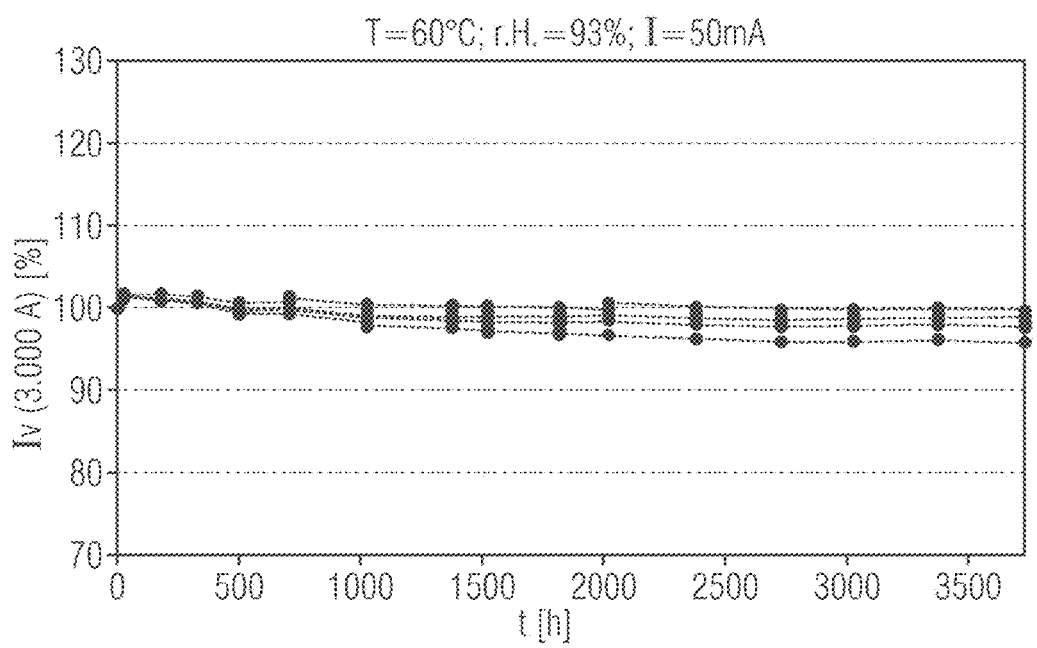
Figure 7H:
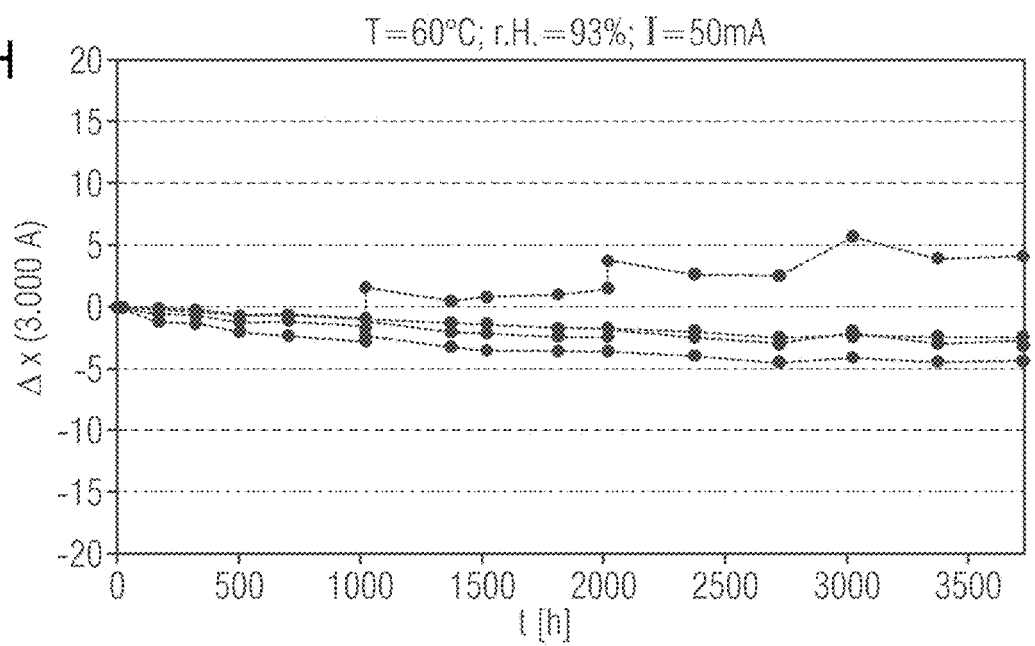

FIG. 6 shows an area 6-1 of the surface of conversion element 2 treated with sandblasting. This reduces the yellowish color impression perceived by the external observer. In addition, the light extraction can be improved and the efficiency increased and/or color location homogeneity over angle can be improved.

FIGS. 7A to 7H each show different robustness tests of the optoelectronic components described here. FIGS. 7A, 7C, 7E and 7G show the dependence on Iv in % and time t in h. Here Iv denotes the luminous intensity measured perpendicular to the main radiating surface relative to the value at 0 h. The FIGS. 7B, 7D, 7F and 7H show the dependency of Δx in units of 0.001 and the time t in h. Δx denotes the absolute change of the x-component of the color location (in the CIE standard color chart) of the total radiation of the component compared to the x-component at 0 h.

As matrix material 221 aluminum phosphate is used, as green conversion material 222 LuAG:Ce and as red conversion material 224 CaAlSiN:Eu. The substrate 21 is a glass substrate with a thickness of 170 μm. The glass is from the company Schott and has the trade name D263. The tests were carried out at different temperatures and operating currents or at a defined temperature and humidity with an area of the semiconductor layer sequence of approx. 1 mm×1 mm. All illustrations show that the optoelectronic components 100 described here have a high stability at high temperatures and operating currents or temperature and humidity.

Figure 8A:
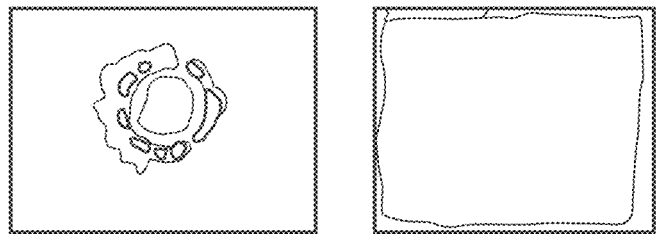
FIGS. 8A to 8D and 9F show optoelectronic components according to comparison examples or an exemplary embodiment.
Figure 8B:
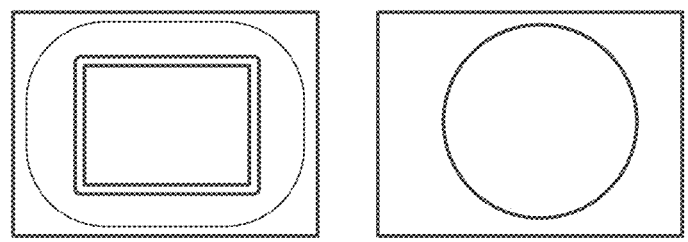
Figure 8C:
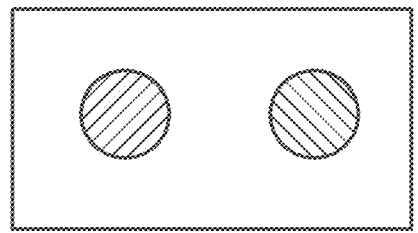
Figure 8D:
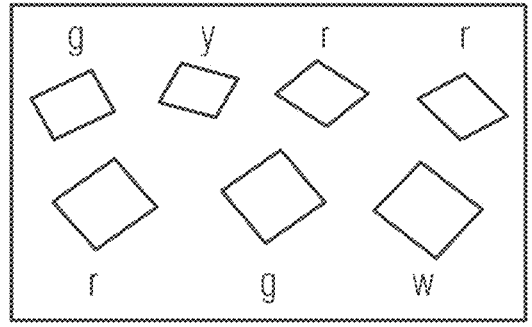

The FIGS. 8A to 8D each show conversion elements as comparison examples (FIGS. 8A to 8C) and an exemplary embodiment (FIG. 8D). The conversion element of FIG. 8A uses silicone as matrix material, the conversion element of FIG. 8B has a ceramic converter, the conversion element of FIG. 8C uses conventional glass as matrix material and the conversion element of FIG. 8D is the conversion element for the component described here with the condensed sol-gel materials described here as matrix material 221 (g—green, y—yellow, r—red, w—warm white).

The component of FIG. 8A cannot be used at high temperatures due to the silicone, as silicone degrades. The component of FIG. 8B can be used for high power optoelectronic components, but no mixture of conversion materials can be used and no warm white components can be provided. This limits the color rendering index of these conversion materials. Although warm white optoelectronic components can be produced for the component of FIG. 8C, these are usually also limited in terms of the color rendering index. The optoelectronic component invented here can overcome all these disadvantages and shows the advantage that by using the inorganic condensed sol-gel material, such as aluminum phosphate, monoaluminum phosphate or modified monoaluminum phosphate, all conventional conversion materials can be mixed in and thus a component with a high luminance and stability can be provided.

In the following, optoelectronic components are each described according to an embodiment.

EXAMPLE 1

Aluminum Phosphate[6] Warm White Converter With High CRI and R9

A suspension of aluminum phosphate with a warm white phosphor mixture[1] is produced. Optionally, the suspension can be diluted with distilled water to adjust viscosity. The solid to liquid mass ratio should be between 1:2 and 1:0.3, in particular between 1:1.5 and 1:0.4, ideally 1:0.5. For example, the suspension is applied to a substrate[2] using doctor blading. The doctor blade gap can be between 10-200 μm, in particular between 30-100 μm and ideally between 40-80 μm. The application speed is typically varied between 1-99 mm/sec. After the coating process, the freshly coated substrate is pre-dried under normal air, a clean room or a drying cabinet. The room temperature and humidity can be kept constant between 18-50° C. and 0-80 g/m$^3$, in particular between 18-30° C. and 0-50 g/m$^3$ and ideally between 19-23° C. and 0-30 g/m$^3$. After pre-drying, the substrate is typically cut into equal parts with a diamond cutter and baked at temperatures between 150° C.-450° C. for 10 to 120 minutes.

Figure 9A:
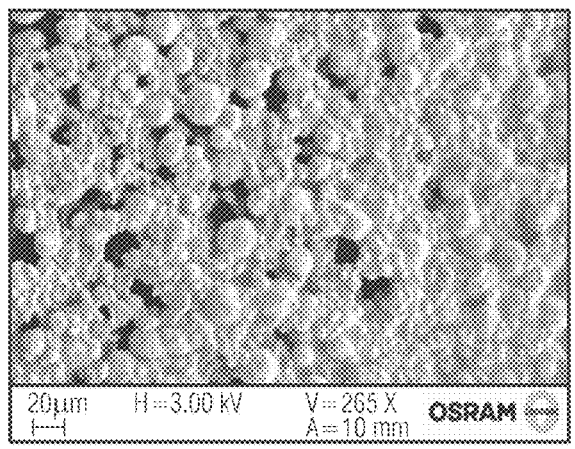
Figure 9B:
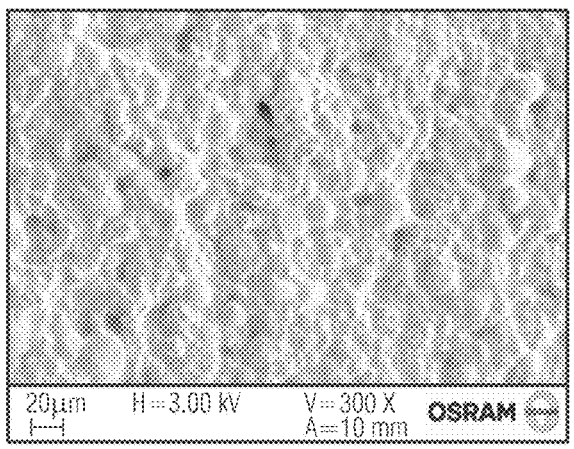

FIGS. 9A and 9B show two exemplary SEM images (top view) of a sample with aluminum phosphate and warm white phosphor mixture.

Figure 9C:
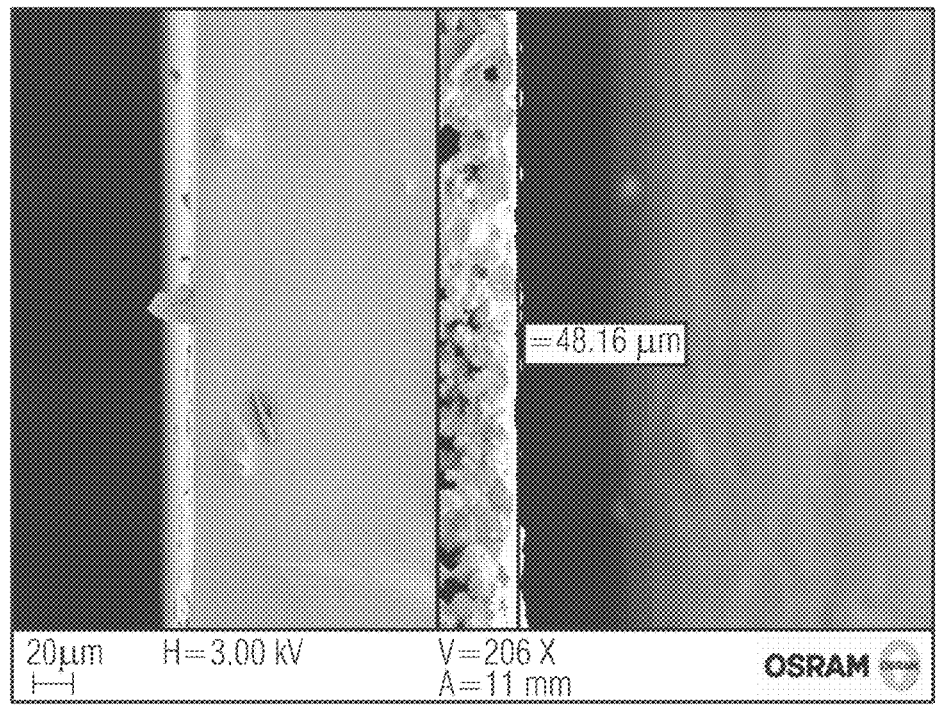

FIG. 9c shows an exemplary side view of a sample with aluminum phosphate and warm white phosphor mixture. H means high voltage, A means working distance and V means magnification.

After baking, the substrates are further refined by polishing, lapping, grinding or a combination of the various methods.

Figure 9D:
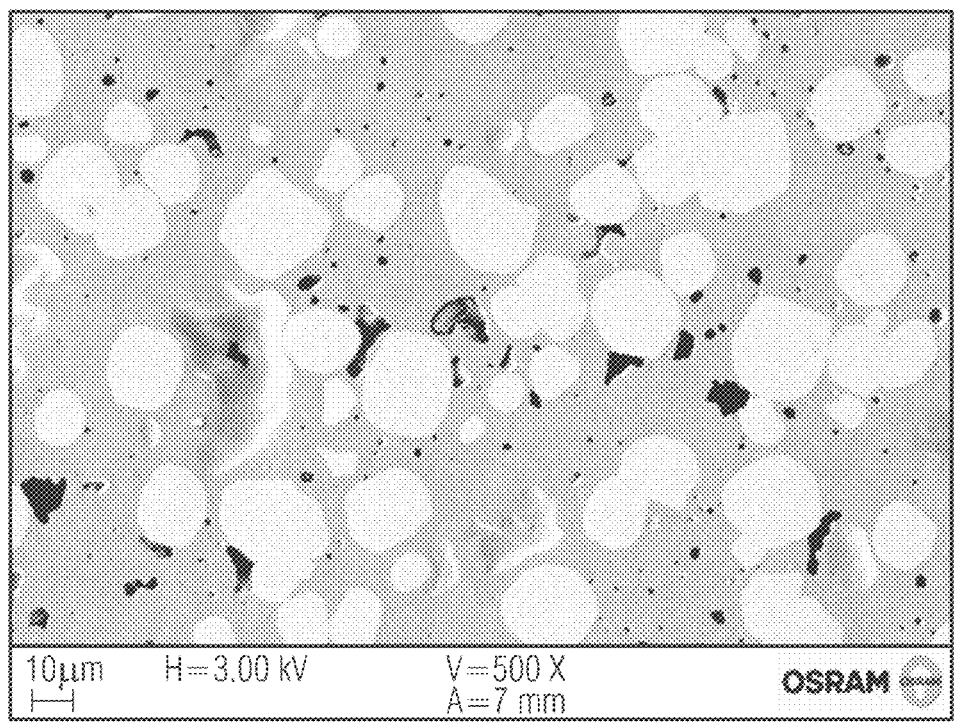

FIG. 9D shows an exemplary SEM image of a polished aluminum phosphate warm white coating.

Figure 9E:
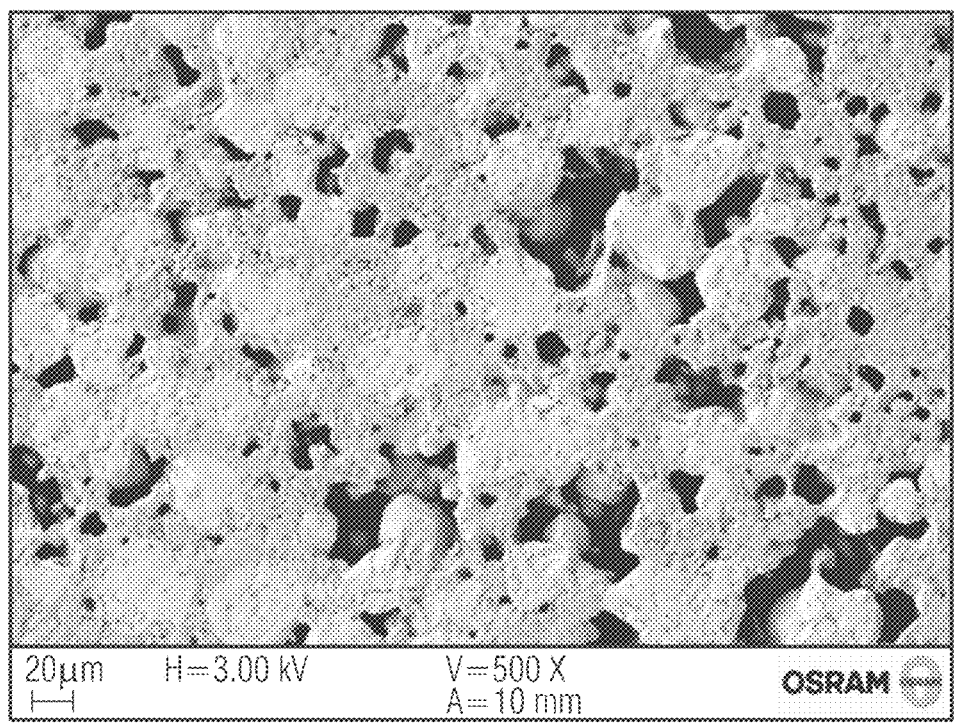

FIG. 9E shows an exemplary SEM image of a polished aluminum phosphate warm white coating. After the final surface treatment, the substrate is typically cut using a wafer or laser saw into converters measuring 1 mm×1 mm, for example.

Figure 9F:
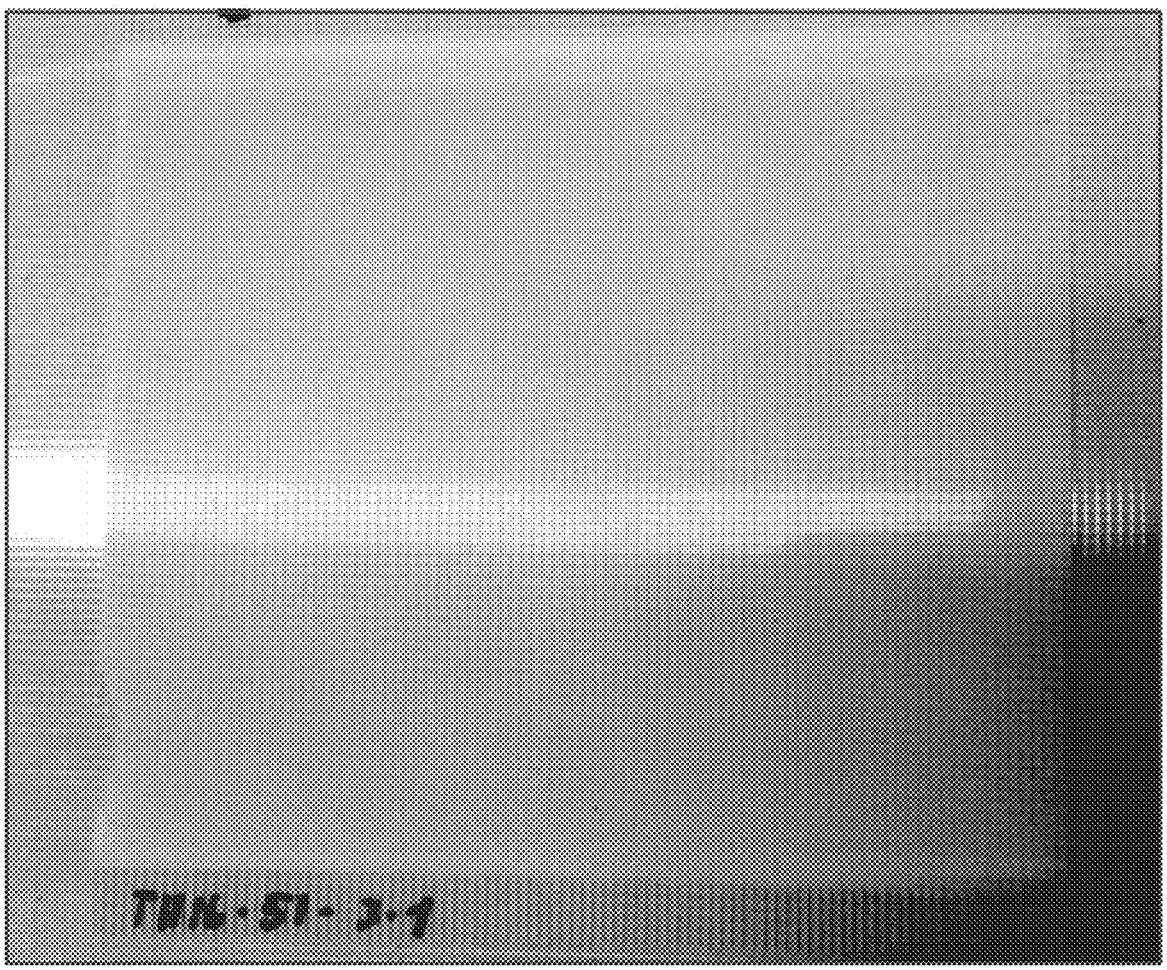

FIG. 9F shows an image of a sawn aluminum phosphate warm white converter.

EXAMPLE 2

Aluminum Phosphate[6] Cold White Converter

A suspension of aluminum phosphate with a garnet phosphor[3] is produced. Optionally, the suspension can be supplemented with at least one additional phosphor, for example, to vary the CRI, R9, the emission color or color temperature. In addition, the viscosity can be adjusted by adding distilled water. The solid to liquid mass ratio can be between 1:2 and 1:0.3, in particular between 1:1.5 and 1:0.4, ideally 1:0.5. For example, the suspension is applied to a substrate[2] using doctor blading. The doctor blade gap can be between 10-200 μm, in particular between 30-100 μm and ideally between 40-80 μm. The application speed can be varied between 1-99 mm/sec. After the coating process, the freshly coated substrate is pre-dried under normal air, in a clean room or a drying cabinet. The room temperature and humidity can be kept constant between 18-50° C. and 0-80 g/m$^3$, in particular between 18-30° C. and 0-50 g/m$^3$ and ideally between 19-23° C. and 0-30 g/m$^3$. After pre-drying, the substrate can typically be cut into equal parts with a diamond cutter and baked at temperatures between 150° C.-450° C. for 10 to 120 minutes.

After baking, the substrates can be further refined by polishing, lapping, grinding or a combination of the various methods. After the final surface treatment, the substrate can typically be cut using a wafer or laser saw into converters measuring 1 mm×1 mm, for example.

EXAMPLE 3

Aluminum Phosphate[6] Red Converter

A suspension of aluminum phosphate with a nitridic phosphor[4] is prepared. Optionally, the suspension can be supplemented with at least one additional phosphor, for example, to vary the CRI, R9, emission color or color temperature. In addition, the viscosity can be adjusted by adding distilled water. The solid to liquid mass ratio can be between 1:2 and 1:0.3, in particular between 1:1.5 and 1:0.4, ideally 1:0.5. For example, the suspension is applied to a substrate[2] using doctor blading. The doctor blade gap can be between 10-200 μm, in particular between 30-100 μm and ideally between 30-70 μm. The application speed can typically be varied between 1-99 mm/sec. After the coating process, the freshly coated substrate is pre-dried under normal air, in a clean room or a drying cabinet. The room temperature and humidity can be kept constant between 18-50° C. and 0-80 g/m$^3$, in particular between 18-30° C. and 0-50 g/m$^3$ and ideally between 19-23° C. and 0-30 g/m$^3$. After pre-drying, the substrate can typically be cut into equal parts with a diamond cutter and baked at temperatures between 150° C.-450° C. for 10 to 120 minutes.

After baking, the substrates can be further refined by polishing, lapping, grinding or a combination of the various methods. After the final surface treatment, the substrate can typically be cut using a wafer or laser saw into converters measuring 1 mm×1 mm, for example.

EXAMPLE 4

Aluminum Phosphate[6] Phosphors Converter

A suspension of aluminum phosphate with a phosphors or conversion material is produced. Optionally, the suspension can be supplemented with at least one additional phosphor or conversion material, for example, to vary the CRI, the emission color or the color temperature. In addition, the viscosity can be adjusted by adding distilled water. The solid to liquid mass ratio can be between 1:2 and 1:0.3, in particular between 1:1.5 and 1:0.4, ideally 1:0.5. For example, the suspension is applied to a substrate[2] using doctor blading. The doctor blade gap can be between 10-200 μm, in particular between 30-100 μm and ideally between 40-80 μm. The application speed can typically be varied between 1-99 mm/sec. After the coating process, the freshly coated substrate is pre-dried under normal air, in a clean room or a drying cabinet. The room temperature and humidity can be kept constant between 18-50° C. and 0-80 g/m$^3$, in particular between 18-30° C. and 0-50 g/m$^3$ and ideally between 19-23° C. and 0-30 g/m$^3$. After pre-drying, the substrate can typically be cut into equal parts with a diamond cutter and baked at temperatures between 150° C.-450° C. for 10 to 120 minutes.

After baking, the substrates can be further refined by polishing, lapping, grinding or a combination of the various methods. After the final surface treatment, the substrate can typically be cut using a wafer or laser saw into converters measuring 1 mm×1 mm, for example.

[1] Warm white phosphor mixture for high CRI and R9 applications:
Garnet phosphor (e.g., $(Lu,Y,Gd,Tb,Ce)_3(Al,Ga)_5O_{12}$, especially $(Y,Lu,Ce)_3(Al,Ga)_5O_{12}$, especially $(Lu,Ce)_3(Al_{1-x}Ga_x)_5O_{12}$ with a Ga content of 0%<=x<=60%) with at least one

- "258": $M_2(Al,Si)_5(N,O)8$-like phosphor doped with Eu (M=Ca, Sr, Ba, Mg) or a phosphor derived therefrom and/or
"(S)CASN": phosphor as in EP 1696016 A1 or WO 2005052087 A1, the disclosure content of which is hereby taken up by withdrawal, for example $(Sr,Ca)AlSi(N,O)_3$:Eu and/or
A "226" phosphor with an activator content of >=0.5%, especially >=2%, especially >=3% with divalent metals such as Sr and/or Ca, for example $Sr(Sr,Ca)Si_2Al_2N_6$:Eu The suspension is typically produced in a speed mixer or ball mill.

[2] Alternative Substrate Materials
sapphire
(reflective) metal substrate
Polymer film or substrate
ceramic substrate
Pre-coated substrates, e.g., glass substrate with $Al_2O_3$ coating
Before coating, for example, a plasma process can be carried out to clean or activate the surface.

[3] Chemical Composition of a Garnet Phosphor
Garnet phosphor (e.g., $(Lu,Y,Gd,Tb,Ce)_3(Al,Ga)_5O_{12}$, especially $(Y,Lu,Ce)_3(Al,Ga)_5O_{11}$, especially $(Lu,Ce)_3(Al_{1-x}Ga_x)_5O_{12}$ with a Ga content of 0%<=x<=60%)

[4] Chemical Compositions of a Nitride Phosphor
- "258": $M_2(Al,SO_5(N,O)8$-like phosphor doped with Eu (M=Ca, Sr, Ba) or phosphor derived therefrom, for example $(Sr,Ba,Ca,Mg)_2Si_5N8$:Eu
(S)CASN": phosphor as described in EP1696016 A1/WO 2005052087 A1, for example $(Sr,Ca)AlSi(N,O)_3$:Eu and/or
A "226" phosphor with an activator content of >=0.5%, especially >=2%, especially >=3% with divalent metals such as Sr and/or Ca, for example $Sr(Sr,Ca)Si_2Al_2N_6$:Eu

[5] Phosphor
$(Y,Gd,Tb,Lu)_3(Al,Ga)_5O_{12}:Ce^{3+}$
$(Sr,Ca)AlSiN_3:Eu^{2+}$
$(Sr,Ba,Ca,Mg)_2Si_5N_8:Eu^{2+}$
$(Ca,Sr,Ba)_2SiO_4:Eu^{2+}$
$\alpha\text{-SiAlON}:Eu^{2+}$
$\beta\text{-SiAlON}:Eu^{2+}$
$(Sr,Ca)S:Eu^2$
$(Sr,Ba,Ca)_2(Si,Al)_5(N,O)_8:Eu^{2+}$
$(Ca,Sr)_8Mg(SiO_4)_4Cl_2:Eu^{2+}$
$(Sr,Ba)Si_2N_2O_2:Eu^{2+}$

[6] Alternative Matrix Materials
Potassium water glass with aluminum phosphate hardener
lithium water glass
mixed water glass, for example, lithium water glass: potassium water glass with a mass fraction of 1 to 1

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features as described in the general part.

The invention is not limited by the description based on the exemplary embodiments of these. Rather, the invention includes any new feature as well as any combination of features, which in particular includes any combination of features in the patent claims, even if this feature or combination itself is not explicitly mentioned in the patent claims or exemplary embodiments.

The invention claimed is:
1. An optoelectronic component comprising:
a semiconductor layer sequence having an active region configured to emit radiation at least via a main radiation exit surface during operation; and
a self-supporting conversion element arranged in a beam path of the semiconductor layer sequence,
wherein the self-supporting conversion element comprises a substrate and subsequently a first layer,
wherein the first layer comprises at least one conversion material embedded in a matrix material,
wherein the conversion material in the matrix material has a concentration gradient,
wherein the first layer comprises a surface facing away from the substrate, in which particles of the conversion material are partially not covered by the matrix material,
wherein the surface is smooth,
wherein the matrix material comprises at least one condensed sol-gel material selected from the group consisting of water glass, metal phosphate, monoaluminum phosphate, aluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane and metal alkoxane,
wherein the condensed sol-gel material has a proportion between 10 and 70 vol % in the first layer, and
wherein the substrate is free of the sol-gel material and the conversion material and mechanically stabilizes the first layer.

2. The optoelectronic component according to claim 1, wherein the substrate is glass, glass ceramic, sapphire, a transparent ceramic or a translucent ceramic.

3. The optoelectronic component according to claim 1, wherein the self-supporting conversion element is arranged on the main radiation exit surface by an adhesive.

4. The optoelectronic component according to claim 3, wherein the adhesive is a silicone and the self-supporting conversion element is free of silicone.

5. The optoelectronic component according to claim 3, wherein the adhesive comprises a thickness of 500 nm to 15 µm.

6. The optoelectronic component according to claim 1, wherein the first layer comprises a layer thickness between 20 µm and 70 µm for partial conversion or 30 µm to 150 µm for full conversion.

7. The optoelectronic component according to claim 1, wherein the first layer is disposed on the main radiation exit surface by an adhesive, and wherein the first layer is disposed directly on the substrate.

8. The optoelectronic component according to claim 1, wherein the optoelectronic component is configured to emit the radiation with a color temperature between 2500 K and 4500 K during the operation.

9. The optoelectronic component according to claim 1, wherein the optoelectronic component is configured to emit the radiation with a color temperature between 4500 K and 8000 K during the operation.

10. The optoelectronic component according to claim 1, wherein the condensed sol-gel material comprises a proportion between 20 and 50 vol % in the first layer.

11. The optoelectronic component according to claim 1, wherein the at least one conversion material is selected from the group consisting of $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu^2$, $(Sr,Ba,Ca)_2(Si,Al)_5(N,O)_8:Eu^{2+}$, $(Ca,Sr)_8Mg(SiO_4)_4Cl_2:Eu^{2+}$, and $(Sr,Ba)Si_2N_2O_2:Eu^{2+}$.

12. The optoelectronic component according to claim 1, wherein at least two different conversion materials are embedded in the matrix material.

13. The optoelectronic component according to claim 1, wherein the substrate comprises a thickness of 50 µm to 200 µm.

14. The optoelectronic component according to claim 1, wherein the matrix material is the condensed sol-gel material prepared from an aluminum phosphate solution or from a monoaluminum phosphate solution or from a modified monoaluminum phosphate solution.

15. A method for producing the optoelectronic component according to claim 1, the method comprising:
providing the semiconductor layer sequence comprising the active region; and
applying the conversion element at least to the main radiation exit surface, wherein the conversion element is produced as follows:
introducing the at least one conversion material into the matrix material to form a dispersion, wherein the matrix material comprises at least one solution of a sol-gel material selected from the group consisting of the water glass, the metal phosphate, the monoaluminum phosphate, the aluminum phosphate, the modified monoaluminum phosphate, the alkoxytetramethoxysilane, the tetraethylorthosilicate, the methyltrimethoxysilane, the methyltriethoxysilane, the titanium alkoxide, the silica sol, the metal alkoxide, the metal oxane and the metal alkoxane;
applying the dispersion to the substrate to form the first layer, wherein the substrate is free of the sol-gel material and the conversion material;
heating the substrate and the first layer to a maximum of 550° C.; and
optionally smoothing the surface of the first layer facing away from the substrate.

16. The method according to claim 15, further comprising separating the substrate and the first layer to produce a plurality of conversion elements, wherein at least one conversion element is arranged on the main radiation exit surface.

17. The optoelectronic component according to claim 1, wherein the conversion element is free of fillers.

18. An optoelectronic component comprising:
a semiconductor layer sequence having an active region configured to emit radiation at least via a main radiation exit surface during operation; and
a self-supporting conversion element arranged in a beam path of the semiconductor layer sequence,
wherein the self-supporting conversion element is arranged on the main radiation exit surface by an adhesive,
wherein the adhesive is a silicone and the self-supporting conversion element is free of silicone,
wherein the adhesive comprises a thickness of 2 µm to 7 µm,
wherein the self-supporting conversion element comprises a substrate and subsequently a first layer,
wherein the first layer is disposed between the main radiation exit surface and the substrate,
wherein the first layer comprises a surface facing away from the substrate, in which particles of at least one conversion material are partially not covered by a matrix material,
wherein the surface is smooth,
wherein the at least one conversion material is embedded in the matrix material in the first layer,
wherein the matrix material comprises at least one condensed sol-gel material selected from the group consisting of water glass, metal phosphate, monoaluminum phosphate, aluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane and metal alkoxane,
wherein the condensed sol-gel material has a proportion between 10 and 70 vol % in the first layer, and
wherein the substrate is free of the sol-gel material and the conversion material and mechanically stabilizes the first layer.

19. An optoelectronic component comprising:
a semiconductor layer sequence having an active region configured to emit radiation at least via a main radiation exit surface during operation; and
a self-supporting conversion element arranged in a beam path of the semiconductor layer sequence,
wherein the self-supporting conversion element comprises a substrate and subsequently a first layer,
wherein the first layer comprises at least one conversion material embedded in a matrix material,
wherein the first layer comprises a surface facing away from the substrate, in which particles of the conversion material are partially not covered by the matrix material and wherein the surface is smooth, wherein the matrix material comprises at least one condensed sol-gel material selected from the group consisting of water glass, metal phosphate, monoaluminum phosphate, aluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane and metal alkoxane,
wherein the condensed sol-gel material has a proportion between 10 and 70 vol % in the first layer,
wherein the substrate is free of the sol-gel material and the conversion material and mechanically stabilizes the first layer, and
wherein the substrate comprises a decoupling foil or decoupling structure.

* * * * *

UNITED STATES PATENT AND TRADEMARK OFFICE
CERTIFICATE OF CORRECTION

PATENT NO. : 11,430,922 B2  
APPLICATION NO. : 16/479198  
DATED : August 30, 2022  
INVENTOR(S) : Joerg Frischeisen Page 1 of 1

It is certified that error appears in the above-identified patent and that said Letters Patent is hereby corrected as shown below:

On the Title Page

Item (73), Assignee; delete "OSKAM OLED GMBH" and insert --OSRAM OLED GMBH--.

Signed and Sealed this  
Twenty-fifth Day of October, 2022

Katherine Kelly Vidal  
*Director of the United States Patent and Trademark Office*